(12) United States Patent
Yang et al.

(10) Patent No.: US 11,380,403 B2
(45) Date of Patent: Jul. 5, 2022

(54) METHOD OF ERASING DATA IN NONVOLATILE MEMORY DEVICE, NONVOLATILE MEMORY DEVICE PERFORMING THE SAME AND MEMORY CONTROLLER PERFORMING THE SAME

(71) Applicant: Samsung Electronics Co., Ltd., Suwon-si (KR)

(72) Inventors: Sunkyu Yang, Hwaseong-si (KR); Wontaeck Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/199,062

(22) Filed: Mar. 11, 2021

(65) Prior Publication Data
US 2022/0013178 A1    Jan. 13, 2022

(30) Foreign Application Priority Data
Jul. 10, 2020    (KR) ........................ 10-2020-0085403

(51) Int. Cl.
| | |
|---|---|
| *G11C 16/04* | (2006.01) |
| *G11C 16/16* | (2006.01) |
| *G11C 16/34* | (2006.01) |
| *H01L 27/11582* | (2017.01) |

(52) U.S. Cl.
CPC .......... *G11C 16/16* (2013.01); *G11C 16/0483* (2013.01); *G11C 16/3445* (2013.01); *H01L 27/11582* (2013.01)

(58) Field of Classification Search
CPC . G11C 16/16; G11C 16/0483; G11C 16/3445; H01L 27/11582
USPC ....................................... 365/185.11, 185.29
See application file for complete search history.

(56) References Cited

U.S. PATENT DOCUMENTS

| | | | |
|---|---|---|---|
| 8,837,224 B2 | 9/2014 | Kim et al. | |
| 8,958,247 B2 | 2/2015 | Asaoka et al. | |
| 9,025,378 B2 | 5/2015 | Tokiwa | |
| 9,053,978 B2 | 6/2015 | Nam | |
| 9,257,195 B2 | 2/2016 | Oh et al. | |
| 9,646,696 B2 | 5/2017 | Yang | |
| 9,881,684 B2 | 1/2018 | Shirakawa | |
| 2019/0385681 A1* | 12/2019 | Yun | G11C 16/32 |
| 2021/0174887 A1* | 6/2021 | Sanada | H01L 27/11582 |

* cited by examiner

*Primary Examiner* — Huan Hoang
(74) *Attorney, Agent, or Firm* — Muir Patent Law, PLLC

(57) ABSTRACT

In a method of erasing data in a nonvolatile memory device including one or more memory blocks, a plurality of memory cells are disposed in a vertical direction in each memory block. An erase loop is performed once or more on an entire of a first memory block in the one or more memory blocks. After the erase loop is successfully completed, a first partial verification operation is performed on one or more groups of a plurality of groups in the first memory block. After the first partial verification operation is successfully completed, it is determined whether a second partial verification operation is required for a group of the one or more groups. The second partial verification operation is performed on one or more subgroups of a plurality of subgroups in a first group requiring the second partial verification operation among the plurality of groups.

20 Claims, 25 Drawing Sheets

| WL# | PVFY1_1 | PVFY1_2 | PVFY1_3 | PVFY1_4 |
|---|---|---|---|---|
| 4M | | | | ▨ |
| ⋮ | | | | ▨ |
| 3M+1 | | | | ▨ |
| 3M | | | ▨ | |
| ⋮ | | | ▨ | |
| 2M+1 | | | ▨ | |
| 2M | | ▨ | | |
| ⋮ | | ▨ | | |
| M+1 | | ▨ | | |
| M | ▨ | | | |
| ⋮ | ▨ | | | |
| 1 | ▨ | | | |

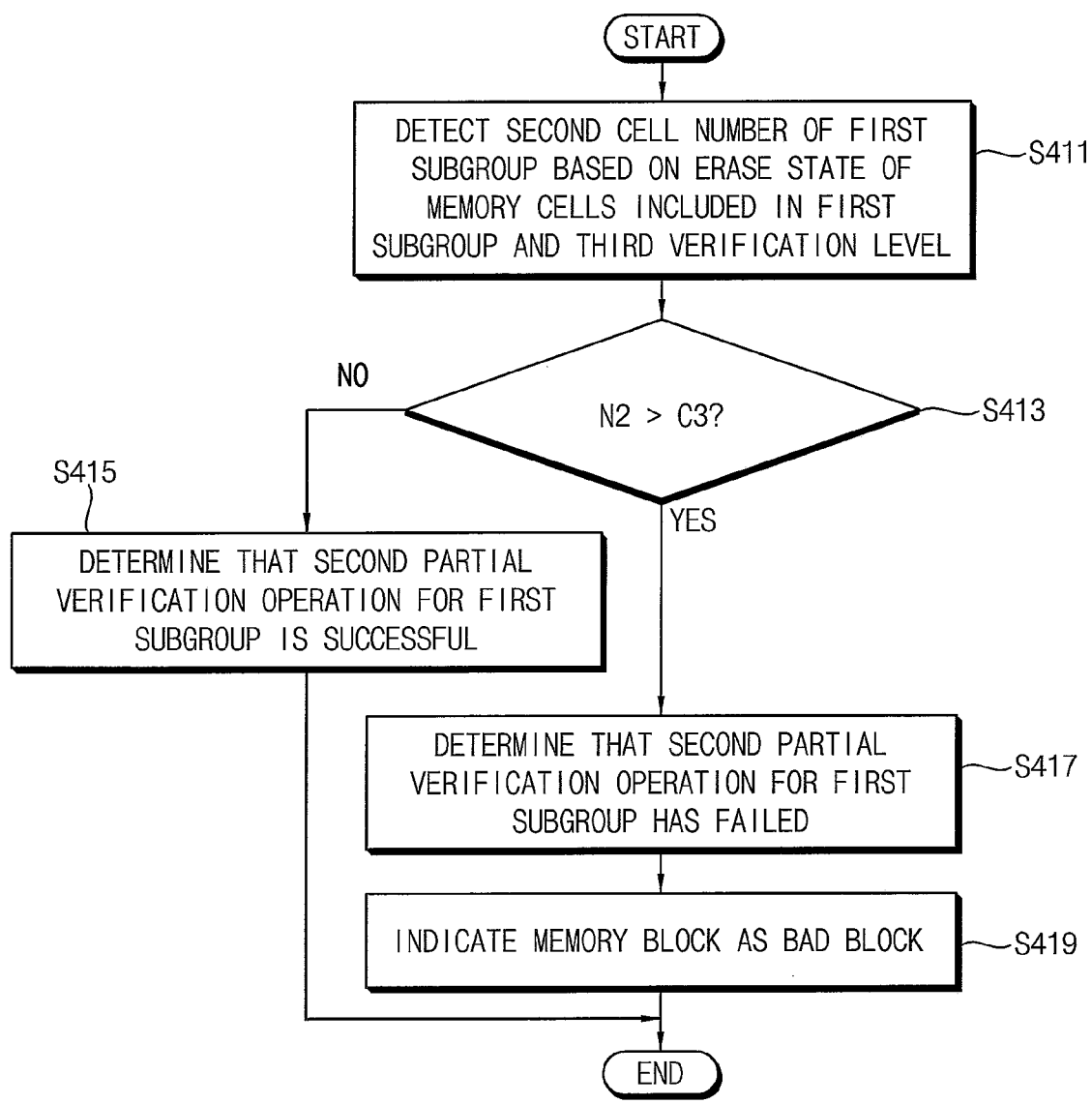

FIG. 19A

| WL# | PVFY2_1 | PVFY2_2 | PVFY2_3 | PVFY2_4 | ... | PVFY2_(Y1-1) | PVFY2_Y1 |
|---|---|---|---|---|---|---|---|
| N | | | | | | | ▨ |
| N-1 | | | | | | ▨ | |
| ... | | | | | | | |
| 4 | | | | ▨ | | | |
| 3 | | | ▨ | | | | |
| 2 | | ▨ | | | | | |
| 1 | ▨ | | | | | | |

FIG. 19B

| WL# | PVFY2_1 | PVFY2_2 | ... | PVFY2_Y2 |
|---|---|---|---|---|
| N | | | | ///// |
| N-1 | | | | ///// |
| ⋮ | | | | |
| 4 | | ///// | | |
| 3 | | ///// | | |
| 2 | ///// | | | |
| 1 | ///// | | | |

FIG. 19C

| WL# | PVFY2_1 | PVFY2_2 | ... | PVFY2_Y3 |
|---|---|---|---|---|
| N | | | | ///// |
| N-1 | | | | ///// |
| N-2 | | | | ///// |
| ⋮ | | | | |
| 6 | | ///// | | |
| 5 | | ///// | | |
| 4 | | ///// | | |
| 3 | ///// | | | |
| 2 | ///// | | | |
| 1 | ///// | | | |

| WL# | PVFY2_1 | PVFY2_2 | PVFY2_3 | ... | PVFY2_Y4 |
|---|---|---|---|---|---|
| N |  |  |  |  | ▨ |
| N-1 |  |  |  |  |  |
| ⋮ |  |  |  |  |  |
| 4 |  |  | ▨ |  |  |
| 3 |  | ▨ |  |  |  |
| 2 |  |  |  |  |  |
| 1 | ▨ |  |  |  |  |

FIG. 23A

| BLK# | LOGICAL ADDRESS | PHYSICAL ADDRESS | STATUS |
|---|---|---|---|
| 1 | LA1 | PA1 | VA |
| 2 | LA2 | PA2 | VA |
| 3 | LA3 | PA3 | VA |
| 4 | LA4 | PA4 | VA |
| ⋮ | | | |

FIG. 23B

| BLK# | LOGICAL ADDRESS | PHYSICAL ADDRESS | STATUS |
|---|---|---|---|
| 1 | LA1 | PA1 | INVA |
| 2 | LA2 | PA2 | VA |
| 3 | LA3 | PA3 | VA |
| 4 | LA4 | PA4 | VA |
| ⋮ | | | |

METHOD OF ERASING DATA IN NONVOLATILE MEMORY DEVICE, NONVOLATILE MEMORY DEVICE PERFORMING THE SAME AND MEMORY CONTROLLER PERFORMING THE SAME

CROSS-REFERENCE TO RELATED APPLICATION

This application claims priority under 35 USC § 119 to Korean Patent Application No. 10-2020-0085403, filed on Jul. 10, 2020 in the Korean Intellectual Property Office (KIPO), the contents of which are herein incorporated by reference in their entirety.

BACKGROUND

1. Technical Field

Example embodiments relate generally to semiconductor integrated circuits, and more particularly to methods of erasing data in nonvolatile memory devices, nonvolatile memory devices performing the methods, and memory controllers performing the methods.

2. Description of the Related Art

Semiconductor memory devices may generally be divided into two categories depending upon whether or not they retain stored data when disconnected from a power supply. These categories include volatile memory devices, which lose stored data when disconnected from power, and nonvolatile memory devices, which retain stored data when disconnected from power. Volatile memory devices may perform read and write operations at a high speed, while contents stored therein may be lost at power-off. Nonvolatile memory devices may retain contents stored therein even at power-off, which means they may be used to store data that must be retained regardless of whether they are powered. Recently, semiconductor memory devices having memory cells that are stacked "vertically" (i.e., in three dimensions (3D)) have been researched to improve the capacity and integration density of the semiconductor memory devices.

SUMMARY

Example embodiments of the present disclosure provide a method of erasing data in a nonvolatile memory device that includes memory cells stacked in three dimensions capable of improving characteristics and reliability of a data erase operation.

Example embodiments of the present disclosure provide a nonvolatile memory device and a memory controller that perform the method of erasing data.

According to example embodiments, in a method of erasing data in a nonvolatile memory device including one or more memory blocks, a plurality of memory cells are disposed in a vertical direction in each memory block. An erase loop is performed once or more on an entire of a first memory block in the one or more memory blocks. The erase loop includes an erase operation and an erase verification operation. After the erase loop is successfully completed, a first partial verification operation is performed on one or more groups of a plurality of groups in the first memory block. The first memory block is divided into the plurality of groups. After the first partial verification operation is successfully completed, it is determined whether a second partial verification operation is required for a group of the one or more groups. The second partial verification operation is performed on one or more subgroups of a plurality of subgroups in a first group requiring the second partial verification operation among the plurality of groups. The first group is divided into the plurality of subgroups.

According to example embodiments, a nonvolatile memory device includes a memory block and a control circuit. The memory block includes a plurality of memory cells disposed in a vertical direction. The control circuit performs an erase loop once or more on an entire of the memory block, performs a first partial verification operation on one or more groups of a plurality of groups in the memory block, determines whether a second partial verification operation is required for a group of the one or more groups, and performs the second partial verification operation on one or more subgroups of a plurality of subgroups in a group requiring the second partial verification operation among the plurality of groups. The erase loop includes an erase operation and an erase verification operation. The memory block is divided into the plurality of groups. The group requiring the second partial verification operation is divided into the plurality of subgroups.

According to example embodiments, in a method of erasing data in a nonvolatile memory device including one or more memory blocks, a plurality of memory cells are disposed in a vertical direction in each memory block. An erase loop is performed once or more on an entire of a first memory block in the one or more memory blocks. The erase loop includes an erase operation performed using an erase voltage and an erase verification operation performed using a first verification voltage having a first verification level. After the erase loop is successfully completed, a first partial verification operation is performed on one or more groups of a plurality of groups in the first memory block using a first reference number and a second verification voltage having a second verification level different from the first verification level. The memory block is divided into the plurality of groups. After the first partial verification operation is successfully completed, it is determined whether a second partial verification operation is required for a group of the one or more groups using a second reference number less than or equal to the first reference number. The second partial verification operation is performed on all or some of a plurality of subgroups in a group requiring the second partial verification operation among the plurality of groups using a third verification level different from the first verification level and a third verification voltage having a third reference number different from the first and second reference numbers. The group requiring the second partial verification operation is divided into the plurality of subgroups. When at least one of the first partial verification operation and the second partial verification operation has failed, the first memory block is indicated as a bad block.

According to example embodiments, a memory controller includes a processor and a buffer memory. The processor generates an erase command and an address corresponding to a first memory block of a nonvolatile memory device such that operations of: performing an erase loop once or more on an entire of the first memory block, performing a first partial verification operation on one or more groups of a plurality of groups in the memory block after the erase loop is successfully completed, determining whether a second partial verification operation is required for a group of the one or more groups after the first partial verification operation is successfully completed, and performing the second partial verification operation on one or more subgroups of a plurality of subgroups in a first group requiring the second partial verification operation among the one or more groups are performed by the nonvolatile memory device based on the erase command and the address. The erase loop includes an erase operation and an erase verification operation. The first memory block is divided into the plurality of groups. The first group requiring the second partial verification operation is divided into the plurality of subgroups. The buffer memory stores an address mapping table including address information of the first memory block. When at least one of the first partial verification operation and the second partial verification operation has failed, the processor is configured to receive a bad block indication signal for the first memory block from the nonvolatile memory device, to load the address mapping table from the buffer memory, to update the address mapping table based on the bad block indication signal to invalidate the address information of the first memory block, and to store the updated address mapping table in the buffer memory.

In the method of erasing data, the nonvolatile memory device and the memory controller according to example embodiments, a block erase operation may be performed on the memory block by performing the erase loop once or more on the entire memory block, the first partial verification operation may be performed by applying a predetermined first criterion to the memory block in units of group, it may be determined whether the second partial verification operation is required by additionally applying a predetermined second criterion to the memory block in units of group, and the second partial verification operation may be performed on a group requiring the second partial verification operation in units of subgroup. Accordingly, the performance and reliability of the block erase operation may be improved or enhanced, and a case where an error is not detected in an erasing operation and an unrecoverable error occurs in a later programming operation, causing the loss of user data, may be prevented.

BRIEF DESCRIPTION OF THE DRAWINGS

Illustrative, non-limiting example embodiments will be more clearly understood from the following detailed description taken in conjunction with the accompanying drawings.

FIG. 17 is a flowchart illustrating an example of performing a second partial verification operation in FIG. 1 according to example embodiments.

FIGS. 18A, 18B, 19A, 19B, 19C and 19D are diagrams for describing an operation of FIG. 17 according to example embodiments.

FIG. 20 is a block diagram illustrating a memory system according to example embodiments.

FIGS. 23A and 23B are diagrams for describing an operation of the memory controller of FIG. 22 according to example embodiments.

DETAILED DESCRIPTION OF THE EMBODIMENTS

Figure 1:
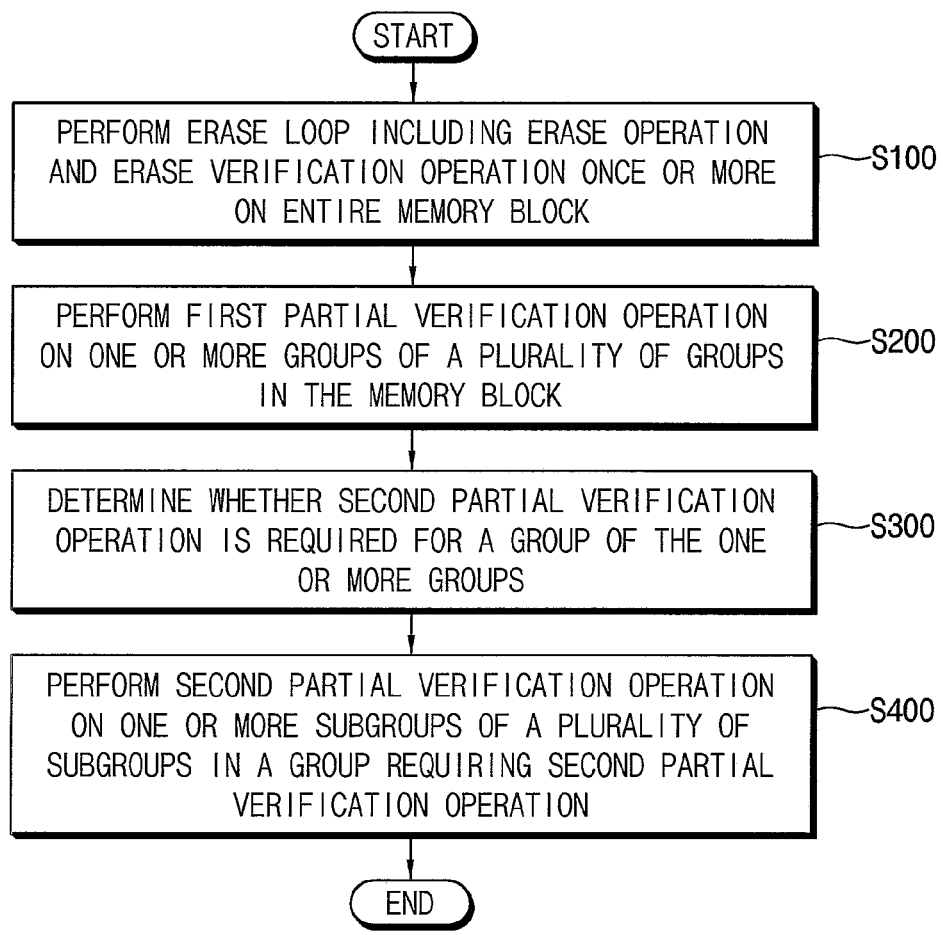
FIG. 1 is a flow chart illustrating a method of erasing data in a nonvolatile memory device according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a flow chart illustrating a method of erasing data in a nonvolatile memory device according to example embodiments.

Referring to FIG. 1, a method of erasing data according to example embodiments is performed by a nonvolatile memory device including one or more memory blocks, and a plurality of memory cells are disposed in a vertical direction in each memory block. For example, each memory block includes a plurality of memory cells that are stacked in a direction intersecting (e.g., substantially perpendicular to) a substrate. Configurations of the nonvolatile memory device and the memory block will be described in detail with reference to FIGS. 2 to 5 and 6A to 6C.

In the method of erasing data in the nonvolatile memory device according to example embodiments, an erase loop that includes an erase operation and an erase verification operation is performed once or more on the entire of the memory block (step S100). For example, the erase operation may be performed using an erase voltage, and the erase verification operation may be performed using an erase verification voltage having a first verification level. Step S100 will be described in detail with reference to FIGS. 7 and 8.

After the erase loop is successfully completed, the memory block is divided into a plurality of groups, and a first partial verification operation is performed on one or more groups of the plurality of groups in the memory block (step S200). For example, the plurality of groups may be divided based on a plurality of wordlines connected to memory cells in the memory block. For example, the first partial verification operation may be performed using a first reference number (or quantity) and an erase verification voltage having a second verification level different from the first verification level. For example, the erase verification voltage may have the second verification level while the first partial verification operation is performed. Step S200 will be described in detail with reference to FIGS. 12, 13 and 14.

In an example embodiment, as will be described with reference to FIG. 14, the first partial verification operation may be performed on all of the plurality of groups in the memory block, or may be performed on only some of the plurality of groups in the memory block.

After the first partial verification operation is successfully completed, it is determined whether a second partial verification operation is required for a group of the one or more groups (step S300). For example, an operation of determining whether the second partial verification operation is required may be performed using a second reference number (or quantity). For example, the second reference number may be different from or equal to the first reference number. Step S300 will be described in detail with reference to FIGS. 15 and 16.

In an example embodiment, as will be described with reference to FIGS. 15 and 16, it is determined whether a second partial verification operation is required for all of the plurality of groups in the memory block, or it is determined whether a second partial verification operation is required for only some of the plurality of groups.

A group requiring the second partial verification operation is divided into a plurality of subgroups, and the second partial verification operation is performed on one or more subgroups of the plurality of subgroups in a group requiring the second partial verification operation among the plurality of groups (step S400). For example, the plurality of subgroups may also be divided based on the plurality of wordlines. For example, the second partial verification operation may be performed using an erase verification voltage having a third verification level different from the first verification level and a third reference number (or quantity) different from the first and second reference numbers. For example, the erase verification voltage may have the third verification level while the second partial verification operation is performed. Step S400 will be described in detail with reference to FIGS. 17 and 18.

In some example embodiments, as will be described with reference to FIGS. 19A, 19B, 19C and 19D, the second partial verification operation may be performed on all of the plurality of subgroups, or may be performed on only some of the plurality of subgroups.

In some example embodiments, when at least one of the first partial verification operation and the second partial verification operation has failed, the memory block may be indicated as a bad block. For example, the memory block may be treated or handled as a runtime bad block (RTBB), and address information of the memory block may be invalidated so that the memory block is no longer used as will be described with reference to FIG. 21.

In some example embodiments, as will be described with reference to FIGS. 9, 10 and 11, an order of performing steps S200, S300 and S400 for the plurality of groups may be changed. The operations of steps S200, S300 and S400 may be referred to as an erase defensive code (e.g., prevention or recovery code) operation or a partial verification defensive code operation.

In the method of erasing data in the nonvolatile memory device according to example embodiments, a block erase operation may be performed on the memory block by performing the erase loop once or more on the entire memory block, the first partial verification operation may be performed by applying a predetermined first criterion (or condition) to the memory block in units of group (e.g., to each group), it may be determined whether the second partial verification operation is required by additionally applying a predetermined second criterion to the memory block in units of group, and the second partial verification operation may be performed on a group requiring the second partial verification operation in units of subgroup. As described above, operations of performing the first partial verification operation after the erase loop and selectively performing the second partial verification operation after the first partial verification operation may be referred to as an adaptive verification after erase. Accordingly, the performance and reliability of the block erase operation may be improved or enhanced, and a case where an error is not detected in an erasing operation and an unrecoverable error (e.g., an uncorrectable error correction code (UECC)) occurs in a later programming operation, causing the loss of user data, may be prevented.

In some example embodiments, the method of erasing data in the nonvolatile memory device according to example embodiments may be performed based on a command and an address for performing the block erase operation on the memory block (e.g., when the command and the address are received).

Although not illustrated in detail, operations of steps S100, S200, S300 and S400 for the remaining memory blocks of the nonvolatile memory device other than the memory block described above may be performed the same as described with reference to FIG. 1.

Figure 2:
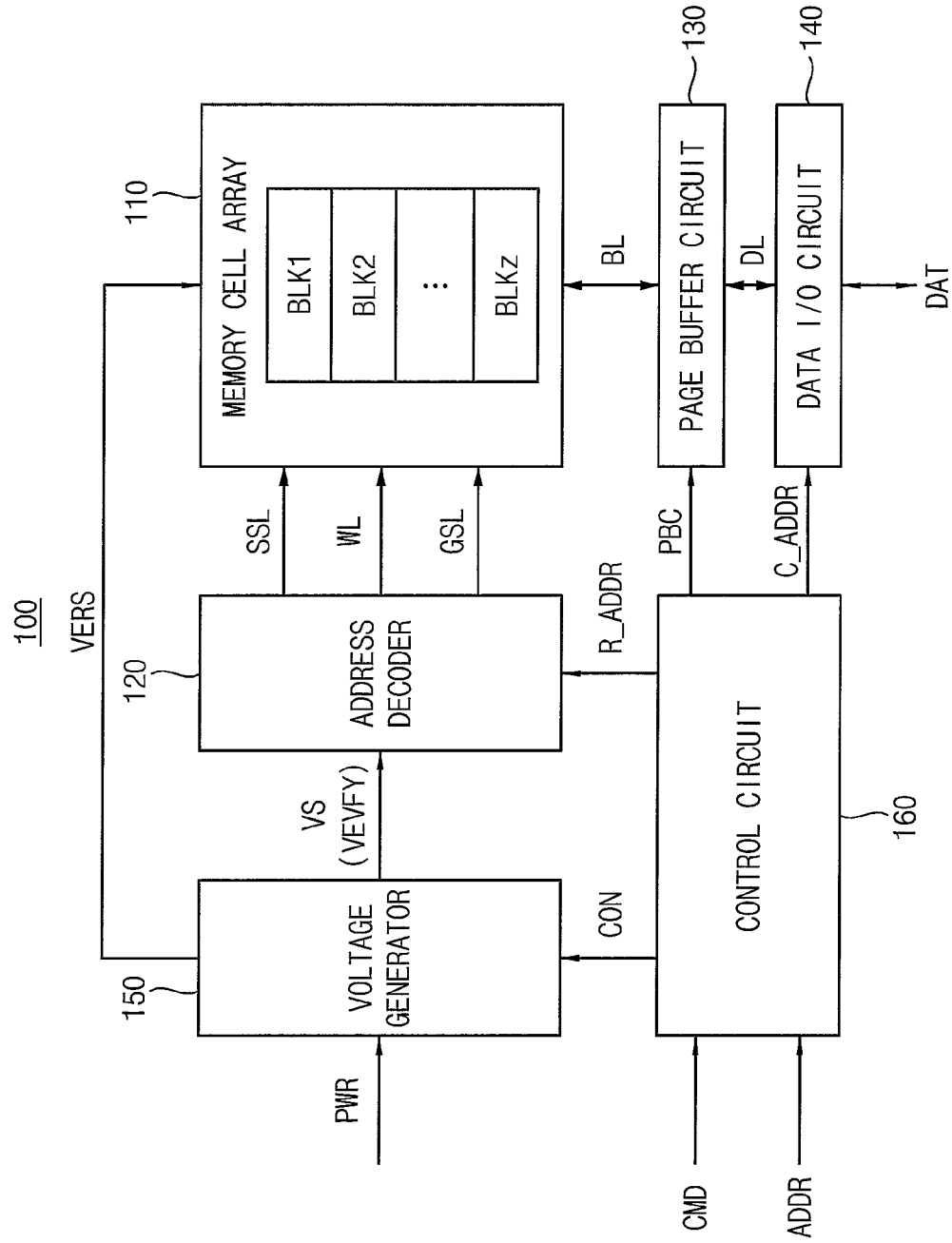
FIG. 2 is a block diagram illustrating a nonvolatile memory device according to example embodiments.

FIG. 2 is a block diagram illustrating a nonvolatile memory device according to example embodiments.

Referring to FIG. 2, a nonvolatile memory device 100 includes a memory cell array 110, an address decoder 120, a page buffer circuit 130, a data input/output (I/O) circuit 140, a voltage generator 150 and a control circuit 160.

The memory cell array 110 is connected to the address decoder 120 via a plurality of string selection lines SSL, a plurality of wordlines WL and a plurality of ground selection lines GSL. The memory cell array 110 is further connected to the page buffer circuit 130 via a plurality of bitlines BL. The memory cell array 110 may include a plurality of memory cells (e.g., a plurality of nonvolatile memory cells) that are connected to the plurality of wordlines WL and the plurality of bitlines BL. The memory cell array 110 may be divided into a plurality of memory blocks BLK1, BLK2, . . . , and BLKz each of which includes memory cells. In addition, each of the plurality of memory blocks BLK1, BLK2, . . . , and BLKz may be divided into a plurality of pages.

In some example embodiments, as will be described with reference to FIGS. 3 and 4, the memory cell array 110 may be a three-dimensional memory cell array, which is formed on a substrate in a three-dimensional structure (or a vertical structure). In this example, the memory cell array 110 may include a plurality of cell strings (e.g., a plurality of vertical NAND strings) that are vertically oriented such that at least one memory cell is located over another memory cell.

The control circuit 160 receives a command CMD and an address ADDR from an outside (e.g., from a memory controller 600 in FIG. 20), and control erasure, program and read operations of the nonvolatile memory device 100 based on the command CMD and the address ADDR. An erasure operation may include performing a sequence of erase loops, and a program operation may include performing a sequence of program loops. Each program loop may include a program operation and a program verification operation. Each erase loop may include an erase operation and an erase verification operation. The read operation may include a normal read operation and data recover read operation.

For example, the control circuit 160 may generate control signals CON, which are used for controlling the voltage generator 150, and may generate control signals PBC for controlling the page buffer circuit 130, based on the command CMD, and may generate a row address R_ADDR and a column address C_ADDR based on the address ADDR. The control circuit 160 may provide the row address R_ADDR to the address decoder 120 and may provide the column address C_ADDR to the data I/O circuit 140.

In addition, the control circuit 160 may control the address decoder 120, the page buffer circuit 130, the data I/O circuit 140 and the voltage generator 150 such that the nonvolatile memory device 100 performs the method of erasing data according to example embodiments described with reference to FIG. 1. For example, the control circuit 160 may perform the erase loop once or more on the entire memory block, may perform the first partial verification operation in units of group after the erase loop is successfully completed, may determine whether the second partial verification operation is required in units of group after the first partial verification operation is successfully completed, and may perform the second partial verification operation for the group requiring the second partial verification operation in units of subgroup.

The address decoder 120 may be connected to the memory cell array 110 via the plurality of string selection lines SSL, the plurality of wordlines WL and the plurality of ground selection lines GSL.

For example, in the data erase/write/read operations, the address decoder 120 may determine at least one of the plurality of wordlines WL as a selected wordline, and may determine the rest or remainder of the plurality of wordlines WL other than the selected wordline as unselected wordlines, based on the row address R_ADDR.

In addition, in the data erase/write/read operations, the address decoder 120 may determine at least one of the plurality of string selection lines SSL as a selected string selection line, and may determine the rest or remainder of the plurality of string selection lines SSL other than the selected string selection line as unselected string selection lines, based on the row address R_ADDR.

Further, in the data erase/write/read operations, the address decoder 120 may determine at least one of the plurality of ground selection lines GSL as a selected ground selection line, and may determine the rest or remainder of the plurality of ground selection lines GSL other than the selected ground selection line as unselected ground selection lines, based on the row address R_ADDR.

The voltage generator 150 may generate voltages VS that are used for an operation of the nonvolatile memory device 100 based on a power PWR and the control signals CON. The voltages VS may be applied to the plurality of string selection lines SSL, the plurality of wordlines WL and the plurality of ground selection lines GSL via the address decoder 120. For example, the voltages VS may include an erase verification voltage VEVFY described with reference to FIG. 1. In addition, the voltage generator 150 may generate an erase voltage VERS that is used for the data erase operation based on the power PWR and the control signals CON. The erase voltage VERS may be applied to the memory cell array 110 directly or via the bitline BL.

For example, during the erase operation, the voltage generator 150 may apply the erase voltage VERS to a common source line and/or the bitline BL of a memory block (e.g., a selected memory block) and may apply an erase permission voltage (e.g., a ground voltage) to all wordlines of the memory block or a portion of the wordlines via the address decoder 120. In addition, during the erase verification operation, the voltage generator 150 may apply the erase verification voltage VEVFY simultaneously to all wordlines of the memory block or sequentially to the wordlines one by one.

For example, during the program operation, the voltage generator 150 may apply a program voltage VPGM to the selected wordline and may apply a program pass voltage VPPASS to the unselected wordlines via the address decoder 120. In addition, during the program verification operation, the voltage generator 150 may apply a program verification voltage VPVFY to the selected wordline and may apply a verification pass voltage VVPASS to the unselected wordlines via the address decoder 120.

In addition, during the normal read operation, the voltage generator 150 may apply a read voltage VREAD to the selected wordline and may apply a read pass voltage VRPASS to the unselected wordlines via the address decoder 120. During the data recover read operation, the voltage generator 150 may apply the read voltage VREAD to a wordline adjacent to the selected wordline and may apply a recover read voltage VRREAD to the selected wordline via the address decoder 120.

The page buffer circuit 130 may be connected to the memory cell array 110 via the plurality of bitlines BL. The page buffer circuit 130 may include a plurality of page buffers. In some example embodiments, each page buffer may be connected to one bitline. In other example embodiments, each page buffer may be connected to two or more bitlines.

The page buffer circuit 130 may store data DAT to be programmed into the memory cell array 110 or may read data DAT sensed from the memory cell array 110. For example, the page buffer circuit 130 may operate as a write driver or a sensing amplifier according to an operation mode of the nonvolatile memory device 100.

The data I/O circuit 140 may be connected to the page buffer circuit 130 via data lines DL. The data I/O circuit 140 may provide the data DAT from an outside of the nonvolatile memory device 100 (e.g., from the memory controller 600 in FIG. 20) to the memory cell array 110 via the page buffer circuit 130 or may provide the data DAT from the memory cell array 110 to the outside of the nonvolatile memory device 100 (e.g., to the memory controller 600 in FIG. 20), based on the column address C_ADDR.

Figure 3:
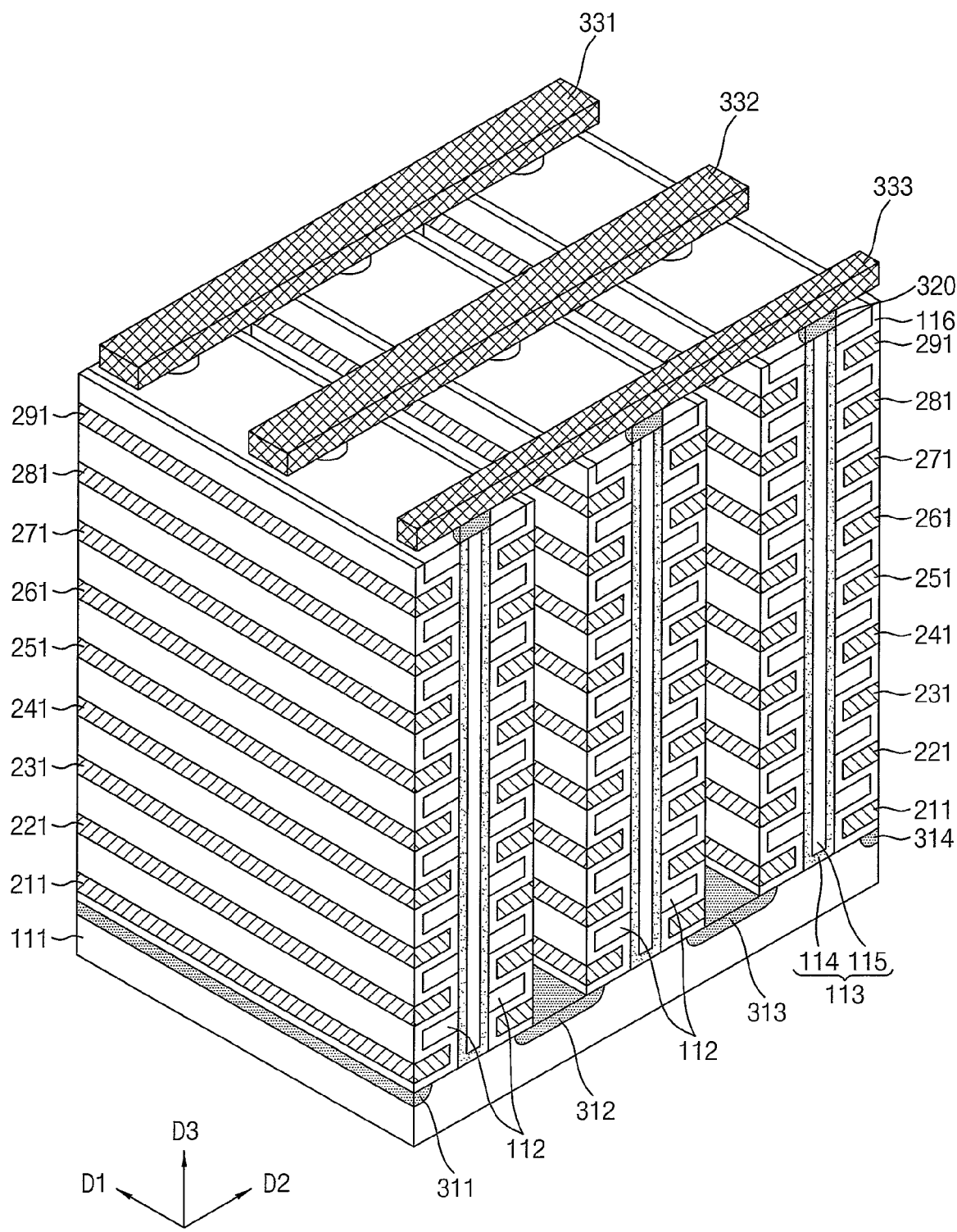
FIG. 3 is a perspective view illustrating an example of a memory block included in a memory cell array of the nonvolatile memory device of FIG. 2 according to example embodiments.

FIG. 3 is a perspective view illustrating an example of a memory block included in a memory cell array of the nonvolatile memory device of FIG. 2 according to example embodiments.

Referring to FIG. 3, a memory block BLKi includes a plurality of cell strings (e.g., a plurality of vertical NAND strings) which are formed on a substrate in a three-dimensional structure (or a vertical structure). The memory block BLKi includes structures extending along the first, second and third directions D1, D2 and D3.

A substrate 111 is provided. For example, the substrate 111 may have a well of a first type of charge carrier impurity (e.g., a first conductivity type) therein. For example, the substrate 111 may have a p-well formed by implanting a group 3 element such as boron (B). In particular, the substrate 111 may have a pocket p-well provided within an n-well. In an embodiment, the substrate 111 has a p-type well (or a p-type pocket well). However, the conductive type of the substrate 111 is not limited to p-type.

First to fourth doping regions 311, 312, 313 and 314 arranged along the second direction D2 are provided in/on the substrate 111. Each of the first to fourth doping regions 311 to 314 may have a second type of charge carrier impurity (e.g., a second conductivity type) different from the first type of the substrate 111. In one embodiment of the invention, the first to fourth doping regions 311 to 314 may have n-type. However, the conductive type of the first to fourth doping regions 311 to 314 is not limited to n-type.

A plurality of insulation materials 112 extending along the first direction D1 are sequentially provided along the third direction D3 on a region of the substrate 111 between the first and second doping regions 311 and 312. For example, the plurality of insulation materials 112 are provided along the third direction D3, being spaced by a specific distance. For example, the insulation materials 112 may include an insulation material such as an oxide layer.

A plurality of pillars 113 penetrating the insulation materials along the third direction D3 are sequentially disposed along the first direction D1 on a region of the substrate 111 between the first and second doping regions 311 and 312. For example, the plurality of pillars 113 penetrate the insulation materials 112 to contact the substrate 111.

In some example embodiments, each pillar 113 may include a plurality of materials. For example, a channel layer 114 of each pillar 113 may include a silicon material having a first conductivity type. For example, the channel layer 114 of each pillar 113 may include a silicon material having the same conductivity type as the substrate 111. In one embodiment of the invention, the channel layer 114 of each pillar 113 includes p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. In some examples, the internal material 115 of each pillar 113 may include an air gap. The term "air" as discussed herein, may refer to atmospheric air, or other gases that may be present during the manufacturing process.

An insulation layer 116 is provided along the exposed surfaces of the insulation materials 112, the pillars 113, and the substrate 111, on a region between the first and second doping regions 311 and 312. For example, the insulation layer 116 provided on surfaces of the insulation material 112 may be interposed between pillars 113 and a plurality of stacked first conductive materials 211, 221, 231, 241, 251, 261, 271, 281 and 291, as illustrated. In some examples, the insulation layer 116 may not be provided on end surfaces of the insulation material 112 in the third direction D3. In this example, the ground selection lines GSL (e.g., 211) are the lowermost ones of the stack of first conductive materials 211 to 291 and the string selection lines SSL (e.g., 291) are the uppermost ones of the stack of first conductive materials 211 to 291.

The plurality of first conductive materials 211 to 291 are provided on surfaces of the insulation layer 116, in a region between the first and second doping regions 311 and 312. For example, the first conductive material 211 extending along the first direction D1 is provided between the insulation material 112 adjacent to the substrate 111 and the substrate 111. In more detail, the first conductive material 211 extending along the first direction D1 is provided between the insulation layer 116 at the bottom of the insulation material 112 adjacent to the substrate 111 and the substrate 111.

A first conductive material extending along the first direction D1 is provided between the insulation layer 116 at the top of the specific insulation material among the insulation materials 112 and the insulation layer 116 at the bottom of a specific insulation material among the insulation materials 112. For example, a plurality of first conductive materials 221 to 281 extending along the first direction D1 are provided between the insulation materials 112 and it may be understood that the insulation layer 116 is provided between the insulation materials 112 and the first conductive materials 221 to 281. The first conductive materials 211 to 291 may be formed of a conductive metal, but in other embodiments of the invention the first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, a plurality of insulation materials 112 are provided, which extend along the first direction D1. A plurality of pillars 113 are provided that are disposed sequentially along the first direction D1 and penetrate the plurality of insulation materials 112 along the third direction D3. An insulation layer 116 is provided on the exposed surfaces of the plurality of insulation materials 112 and the plurality of pillars 113, and a plurality of first conductive materials 211 to 291 extend along the first direction D1. Similarly, the same structures as those on the first and second doping regions 311 and 312 may be provided in a region between the third and fourth doping regions 313 and 314.

A plurality of drain regions 320 are provided on the plurality of pillars 113, respectively. The drain regions 320 may include silicon materials doped with a second type of charge carrier impurity different from the first type of charge carrier impurity. For example, the drain regions 320 may include silicon materials doped with an n-type dopant. In one embodiment of the invention, the drain regions 320 may include n-type silicon materials. However, the drain regions 320 are not limited to n-type silicon materials.

On the drain regions, a plurality of second conductive materials 331, 332 and 333 are provided, which extend along the second direction D2. The second conductive materials 331 to 333 are disposed along the first direction D1, being spaced apart from each other by a specific distance. The second conductive materials 331 to 333 are respectively connected to the drain regions 320 in a corresponding region. The drain regions 320 and the second conductive material 333 extending along the second direction D2 may be connected through each contact plug. Each contact plug may be, for example, a conductive plug formed of a conductive material such as a metal. The second conductive materials 331 to 333 may include metal materials. In some example embodiments, the second conductive materials 331 to 333 may include conductive materials such as a polysilicon.

In the example of FIG. 3, the first conductive materials 211 to 291 may be used to form the wordlines WL, the string selection lines SSL and the ground selection lines GSL. For example, the first conductive materials 221 to 281 may be used to form the wordlines WL, where conductive materials belonging to the same layer may be interconnected. The second conductive materials 331 to 333 may be used to form the bitlines BL. The number of layers of the first conductive materials 211 to 291 may be changed variously according to process and control techniques.

Figure 4:
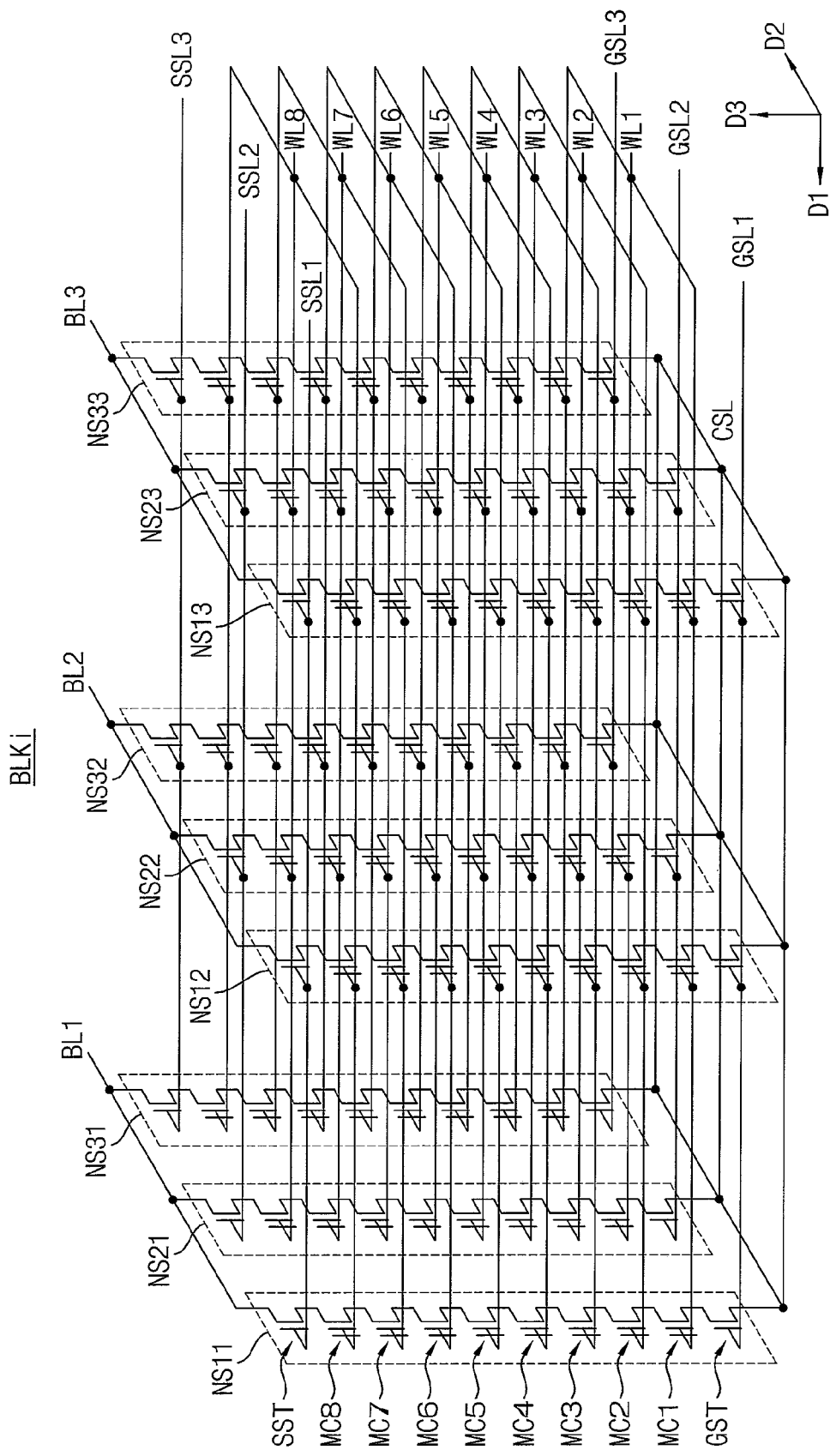
FIG. 4 is a circuit diagram illustrating an equivalent circuit of the memory block described with reference to FIG. 3 according to example embodiments.

FIG. 4 is a circuit diagram illustrating an equivalent circuit of the memory block described with reference to FIG. 3 according to example embodiments.

A memory block BLKi of FIG. 4 may be formed on a substrate in a three-dimensional structure (or a vertical structure). For example, a plurality of NAND strings included in the memory block BLKi may be formed in a direction perpendicular to the substrate.

Referring to FIG. 4, the memory block BLKi may include a plurality of NAND strings NS11, NS12, NS13, NS21, NS22, NS23, NS31, NS32 and NS33 connected between bitlines BL1, BL2 and BL3 and a common source line CSL. Each of the NAND strings NS11 to NS33 may include a string selection transistor SST, a plurality of memory cells MC1, MC2, MC3, MC4, MC5, MC6, MC7 and MC8, and a ground selection transistor GST. For example, the bitlines BL1 to BL3 may correspond to the second conductive materials 331 to 333 in FIG. 3, and the common source line CSL may be formed by interconnecting the first to fourth doping regions 311 to 314 in FIG. 3.

Each string selection transistor SST may be connected to a corresponding string selection line (one of SSL1, SSL2 and SSL3). The plurality of memory cells MC1 to MC8 may be connected to corresponding wordlines WL1, WL2, WL3, WL4, WL5, WL6, WL7 and WL8, respectively. Each ground selection transistor GST may be connected to a corresponding ground selection line (one of GSL1, GSL2 and GSL3). Each string selection transistor SST may be connected to a corresponding bitline (e.g., one of BL1 to BL3), and each ground selection transistor GST may be connected to the common source line CSL. In the example of FIG. 4, some of the string selection transistors SST are connected to the same bitline (e.g., one of BL1 to BL3) to connect corresponding NAND strings to the same bitline up appropriate selection via selection voltages applied to the appropriate sting selection lines SSL1 to SSL3 and ground selection lines GSL1 to GSL3.

The cell strings connected in common to one bitline may form one column, and the cell strings connected to one string selection line may form one row. For example, the cell strings NS11, NS21 and NS31 connected to the first bitline BL1 may correspond to a first column, and the cell strings NS11, NS12 and NS13 connected to the first string selection line SSL1 may form a first row.

Wordlines (e.g., WL1) having the same height may be commonly connected, and the ground selection lines GSL1 to GSL3 and the string selection lines SSL1 to SSL3 may be separated. Memory cells located at the same semiconductor layer share a wordline. Cell strings in the same row share a string selection line. The common source line CSL is connected in common to all of cell strings.

In FIG. 4, the memory block BLKi is illustrated to be connected to eight wordlines WL1 to WL8 and three bitlines BL1 to BL3, and each of the NAND strings NS11 to NS33 is illustrated to include eight memory cells MC1 to MC8. However, the invention not limited thereto. In some example embodiments, each memory block may be connected to any number of wordlines and bitlines, and each NAND string may include any number of memory cells.

A three-dimensional vertical array structure may include vertical NAND strings that are vertically oriented such that at least one memory cell is located over another memory cell. The at least one memory cell may comprise a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

Although the memory cell array included in the nonvolatile memory device according to example embodiments is described based on a NAND flash memory device, the nonvolatile memory device according to example embodiments may be any nonvolatile memory device, e.g., a phase random access memory (PRAM), a resistive random access memory (RRAIVI), a nano floating gate memory (NFGM), a polymer random access memory (PoRAM), a magnetic random access memory (MRAM), a ferroelectric random access memory (FRAM), a thyristor random access memory (TRAM), etc.

Figure 5:
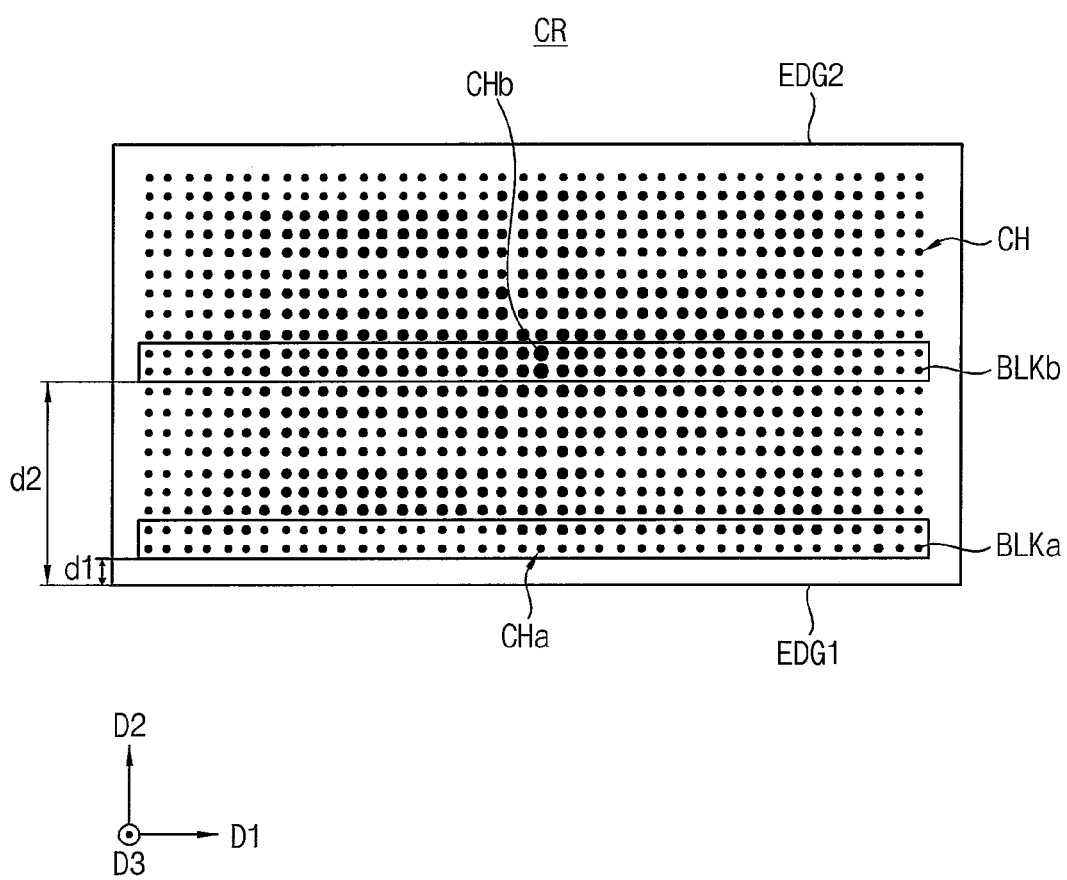
FIG. 5 is a plan view of an example of a cell region included in the memory cell array of FIGS. 3 and 4 according to example embodiments.

FIG. 5 is a plan view of an example of a cell region included in the memory cell array of FIGS. 3 and 4 according to example embodiments.

Referring to FIG. 5, a cell region CR may include a plurality of channel holes CH.

A channel hole size, for example, a channel hole diameter, may vary according to positions within the cell region CR. For example, portions adjacent to first and second edges EDG1 and EDG2 may have a relatively low peripheral density, and thus channel holes CHa adjacent to the first and second edges EDG1 and EDG2 may have different diameters from those of the other channel holes CH. Channel holes CHb located in a center of the cell region CR may have diameters larger than those of the channel holes CHa adjacent to the first and second edges EDG1 and EDG2. A memory block BLKa may be adjacent to the first edge EDG1, and may be spaced apart from the first edge EDG1 by a first distance d1. A memory block BLKb may not be adjacent to the first and second edges EDG1 and EDG2, may be in the center of the cell region CR, and may be spaced apart from the first edge EDG1 by a second distance d2. The second distance d2 may be greater than the first distance d1. A first diameter of the channel hole CHa included in the memory block BLKa may be smaller than a second diameter of the channel hole CHb included in the memory block BLKb.

Figure 6A:
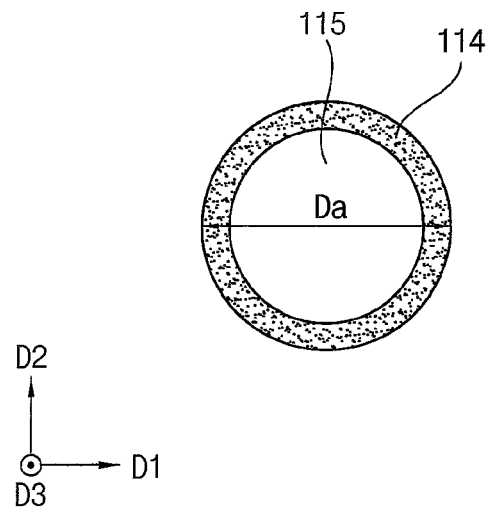
FIGS. 6A, 6B and 6C are diagrams for describing a channel hole formed in the cell region of FIG. 5 according to example embodiments.
Figure 6B:
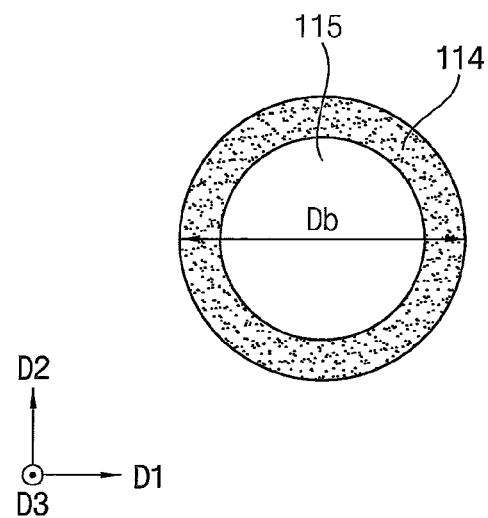
Figure 6C:
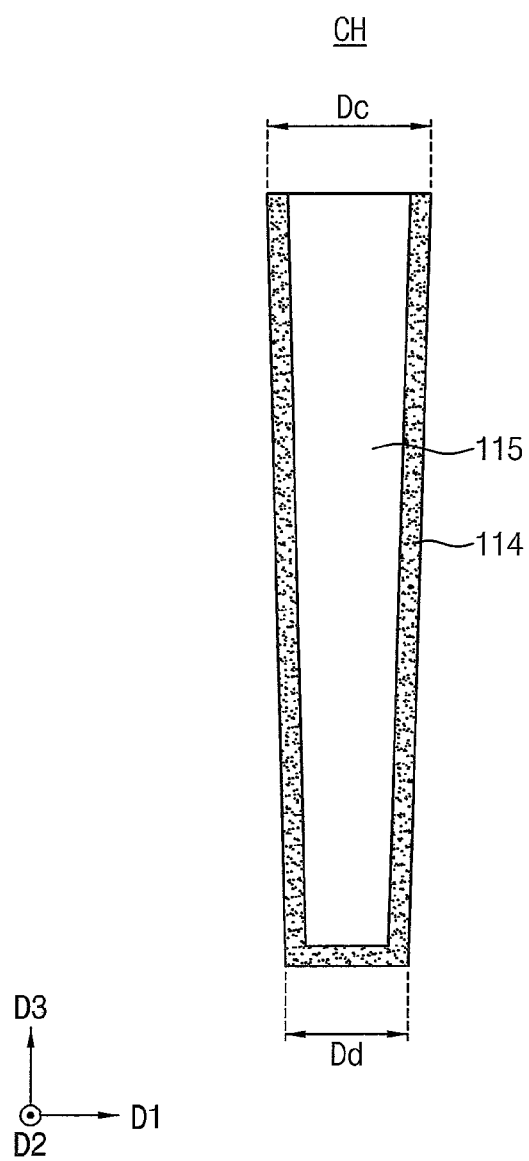

FIGS. 6A, 6B and 6C are diagrams for describing a channel hole formed in the cell region of FIG. 5 according to example embodiments. FIGS. 6A and 6B are plan views of examples of the channel hole. FIG. 6C is a cross-sectional view of an example of the channel hole.

Referring to FIGS. 6A and 6B, a pillar including a channel layer 114 and an internal layer 115 may be formed in the first channel hole CHa included in the memory block BLKa and the second channel hole CHb included in the memory block BLKb. A first diameter Da of the first channel hole CHa may be smaller than a second diameter Db of the second channel hole CHb.

Referring to FIG. 6C, the pillar including the channel layer 114 and the internal layer 115 may be formed in each channel hole CH. For example, the channel hole CH may be drilled from the top to the bottom, and a diameter Dc on a position where the formation of the channel hole CH starts (e.g., on the top) may be larger than a diameter Dd on a position where the formation of the channel hole CH ends (e.g., on the bottom).

As described above, the diameter of the channel hole may vary depending on the position in the cell region CR, and the diameter of the channel hole may also vary depending on the third direction D3 even within one channel hole. Due to the difference in the channel hole diameter, a difference in characteristics of the memory cells and/or defects of the memory cells may occur. For example, a wordline defect causing by a not-open (NOP) string defect in that the channel hole is not completely opened on the position where the formation of the channel hole CH ends in FIG. 6C (e.g., the bottom) may occur. Due to such wordline defect, an error may not be detected in an erasing operation and an unrecoverable error may occur in a later programming operation, causing the loss of user data.

When the method of erasing data in the nonvolatile memory device according to example embodiments is performed, a defect in a specific region (e.g., a lower region) caused by the NOP may be detected using the additional verification after erase (e.g., a vulnerable region in the memory block may be selected and the additional verification may be performed on the selected region), and thus the loss of user data due to the unrecoverable error may be prevented.

Figure 7:
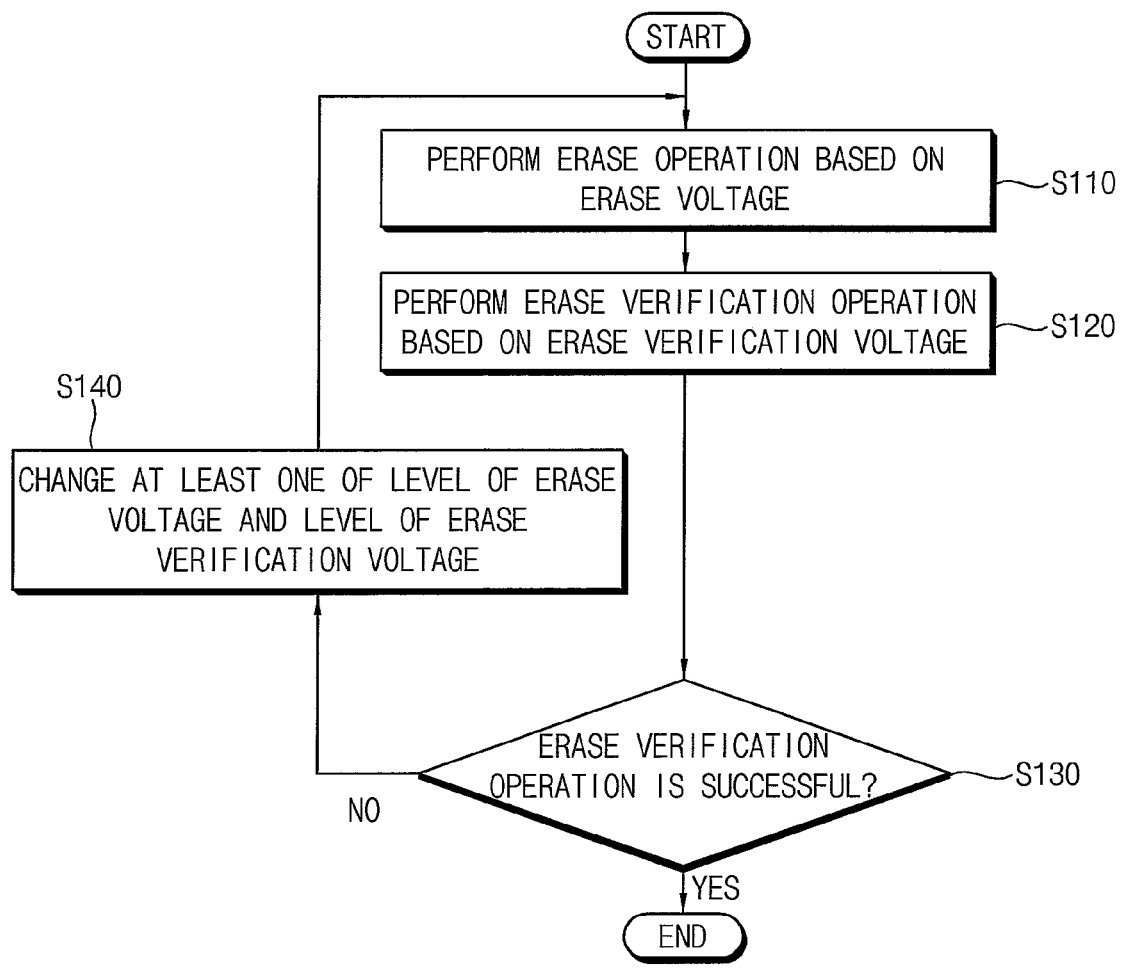
FIG. 7 is a flowchart illustrating an example of performing an erase loop once or more in FIG. 1 according to example embodiments.
Figure 8:
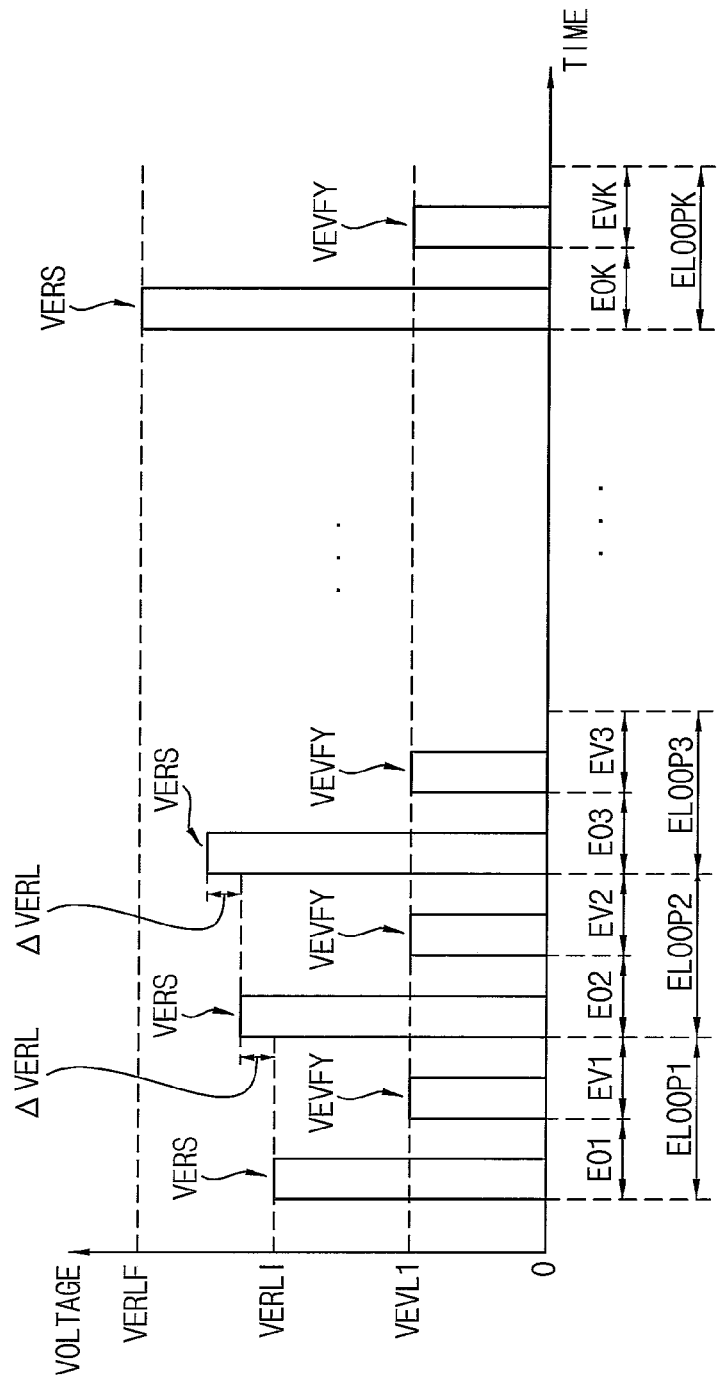
FIG. 8 is a diagram for describing an operation of performing the erase loop once or more of FIG. 7 according to example embodiments.

FIG. 7 is a flowchart illustrating an example of performing an erase loop once or more in FIG. 1 according to example embodiments. FIG. 8 is a diagram for describing an operation of performing the erase loop once or more of FIG. 7 according to example embodiments.

Referring to FIGS. 1, 7 and 8, when performing the erase loop once or more (step S100), the erase operation may be performed on the entire of the memory block based on the erase voltage VERS (step S110). For example, the plurality of memory cells included in the memory block may be connected to a plurality of wordlines. During the erase operation, the erase voltage VERS may be applied to a common source line and/or a bitline of the memory block, and an erase permission voltage (e.g., a ground voltage) may be applied to all of the plurality of wordlines of the memory block.

After that, the erase verification operation may be performed on the entire of the memory block based on the erase verification voltage (step S120). For example, during the erase verification operation, the erase verification operation having the first verification level may be applied to all of the plurality of wordlines of the memory block.

Operations of performing steps S110 and S120 once may represent that the erase loop is performed once.

When it is determined that the erase verification operation is successful (step S130: YES), the process may be terminated without further performing the erase loop.

When it is determined that the erase verification operation has failed (step S130: NO), this means that the plurality of memory cells in the memory block do not have a desired erase state (e.g., a desired threshold voltage distribution), and thus the erase loop may be additionally performed. For example, at least one of a level of the erase voltage and a level of the erase verification voltage may be changed (step S140), and steps S110 and S120 may be performed again based on the level-changed erase voltage and/or the level-changed erase verification voltage. The above-described operations may be repeated until the erase verification operation is successful.

In some example embodiments, steps S110, S120, S130 and S140 may be performed based on an incremental step pulse erase (ISPE) scheme.

For example, as illustrated in FIG. 8, a plurality of erase loops ELOOP1, ELOOP2, ELOOP3, . . . , and ELOOPK may be sequentially performed, where K is a natural number greater than or equal to two. For each erase loop, one of erase operations EO1, EO2, EO3, . . . , and EOK using the erase voltage VERS and a respective one of erase verification operations EV1, EV2, EV3, . . . , and EVK using the erase verification voltage VEVFY may be sequentially performed. A level of the erase voltage VERS in a current erase loop may be higher than that of the erase voltage VERS in a previous erase loop, and the erase verification voltage VEVFY may have a constant level (e.g., a first verification level VEVL1).

For example, in the first erase loop ELOOP1, the erase voltage VERS may have an initial erase level VERLI. In the second erase loop ELOOP2, the erase voltage VERS may have a level that is increased by a step level AVERL from the initial erase level VERLI. In the third erase loop ELOOP3, the erase voltage VERS may have a level that is increased by the step level AVERL from the level of the erase voltage VERS in the second erase loop ELOOP2. In the K-th erase loop ELOOPK which is the last erase loop, the erase voltage VERS may have a final erase level VERLF.

Although FIG. 8 illustrates that only the level of the erase voltage VERS increases as the erase loop is repeated, the invention is not limited thereto, and the level of the erase verification voltage VEVFY may also increase. In some example embodiments, the level of the erase voltage VERS may decrease and/or the level of the erase verification voltage VEVFY may decrease as the erase loop is repeated. In addition, although FIG. 8 illustrates that the level of the erase voltage VERS increases by a fixed level (e.g., the step level AVERL), the invention is not limited thereto, and the amount of change in the erase voltage VERS may be changed for each erase loop.

Figure 9:
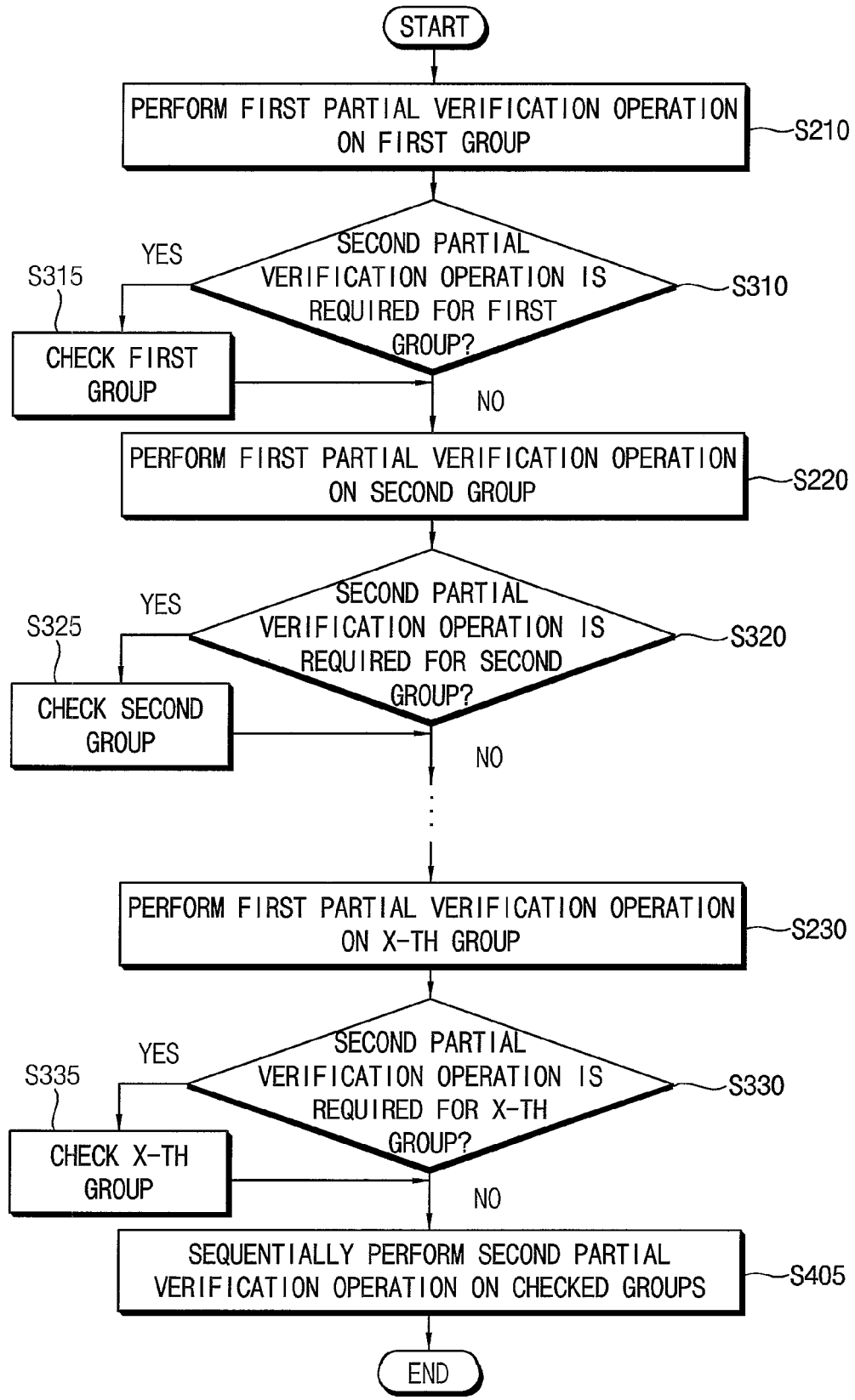
FIGS. 9, 10 and 11 are flowcharts illustrating examples of performing a first partial verification operation, determining whether a second partial verification operation is required, and performing the second partial verification operation in FIG. 1, according to example embodiments.
Figure 10:
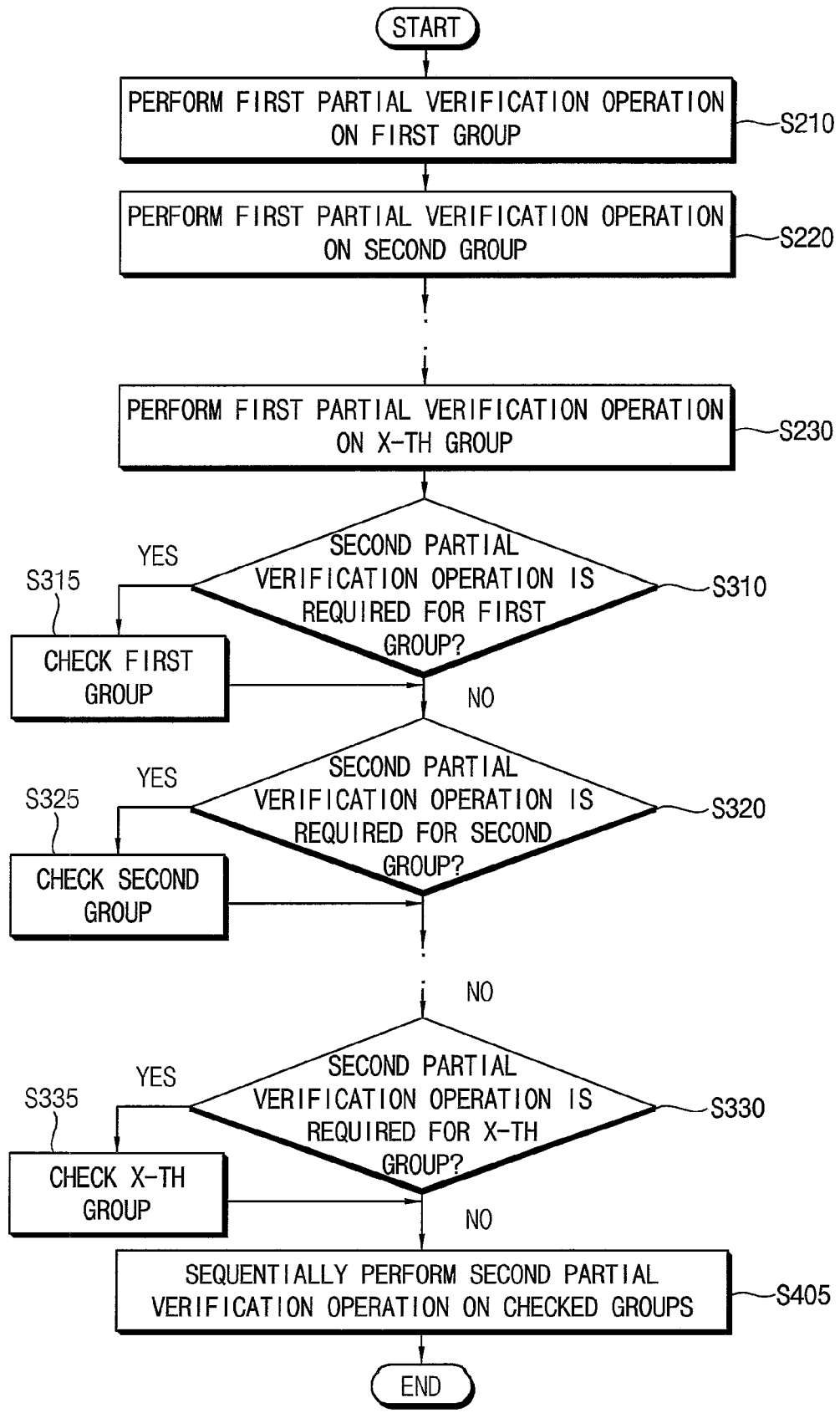
Figure 11:
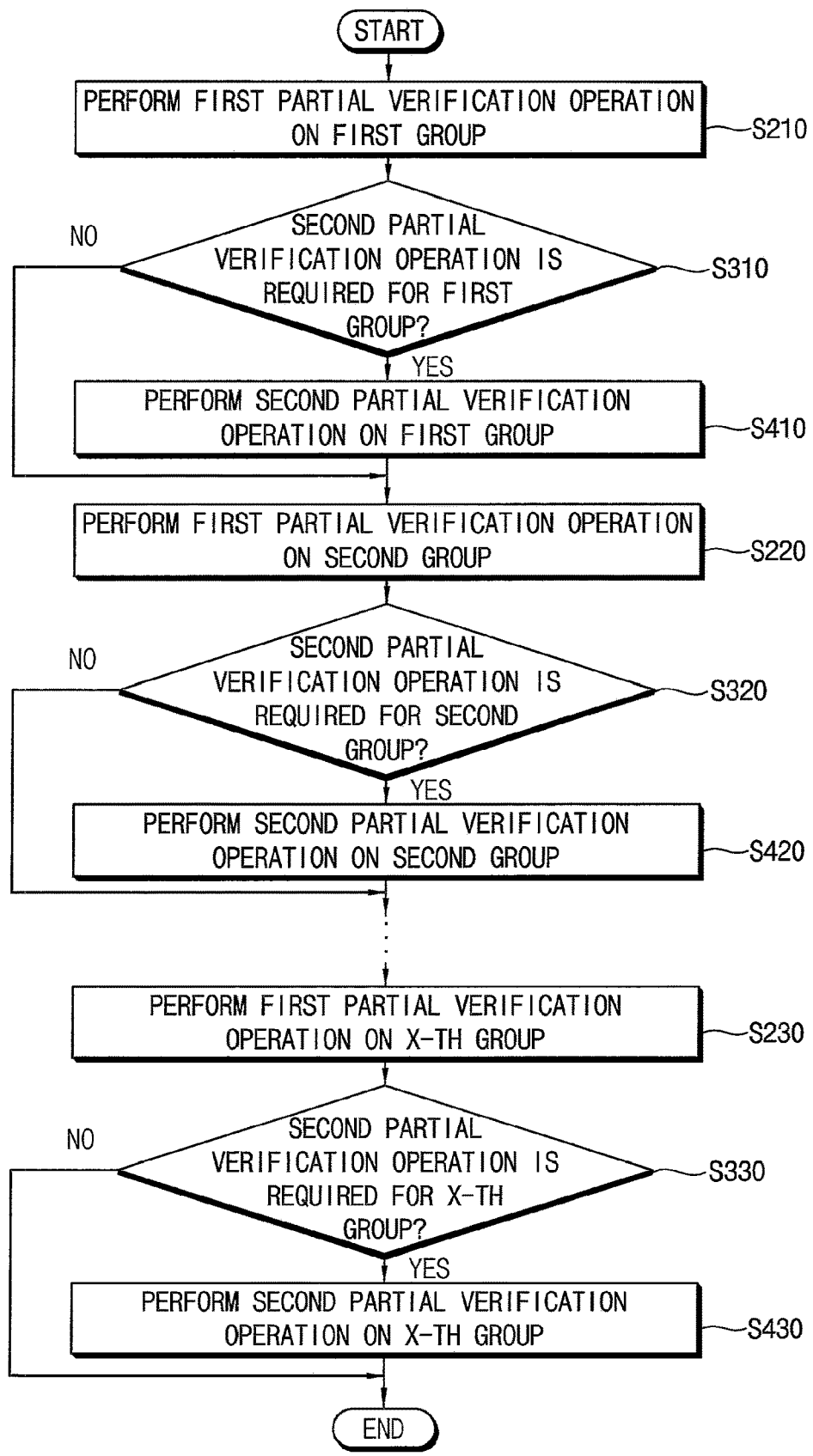

FIGS. 9, 10 and 11 are flowcharts illustrating examples of performing a first partial verification operation, determining whether a second partial verification operation is required, and performing the second partial verification operation in FIG. 1, according to example embodiments.

Referring to FIGS. 1, 9, 10 and 11, in the method of erasing data in the nonvolatile memory device according to example embodiments, the plurality of groups that are included in the memory block and are a target of the first and second partial verification operations may include first through X-th groups, where X is a natural number greater than or equal to two. An order of performing the first partial verification operation, determining whether the second partial verification operation is required, and performing the second partial verification operation for the first through X-th groups may be implemented in various ways.

In some example embodiments, as illustrated in FIG. 9, the first partial verification operation in step S200 and the operation of determining whether the second partial verification operation is required in step S300 may be sequentially performed on each of the first through X-th groups, and then the second partial verification operation in step S400 may be sequentially performed only on groups requiring the second partial verification operation.

For example, the first partial verification operation on the first group may be performed (step S210). It may be determined whether the second partial verification operation is required for the first group (step S310). If the second partial verification operation is required for the first group (step S310: YES), the first group may be checked (step S315). If the second partial verification operation is not required for the first group (step S310: NO), the verification operation for the first group may be terminated.

After that, the first partial verification operation on a second group may be performed (step S220). It may be determined whether the second partial verification operation is required for the second group (step S320). If the second partial verification operation is required for the second group (step S320: YES), the second group may be checked (step S325). If the second partial verification operation is not required for the second group (step S320: NO), the verification operation for the second group may be terminated.

In addition, the first partial verification operation on the X-th group may be performed (step S230). It may be determined whether the second partial verification operation is required for the X-th group (step S330). If the second partial verification operation is required for the X-th group (step S330: YES), the X-th group may be checked (step S335). If the second partial verification operation is not required for the X-th group (step S330: NO), the verification operation for the X-th group may be terminated.

Finally, the second partial verification operation may be sequentially performed on groups checked by steps S315, S325 and S335 (e.g., the groups requiring the second partial verification operation) (step S405). In example embodiments, address information of the first group may be stored in the step S315, address information of the second group may be stored in the step S325, and address information of the X-th group may be stored in the step S335.

In other example embodiments, as illustrated in FIG. 10, the first partial verification operation in step S200 may be sequentially performed on all of the first through X-th groups, and then the operation of determining whether the second partial verification operation is required in step S300 may be sequentially performed on all of the first through X-th groups, and then the second partial verification operation in step S400 may be sequentially performed only on the groups requiring the second partial verification operation. The descriptions repeated with FIG. 9 will be omitted.

For example, step S210 may be performed on the first group, step S220 may be performed on the second group, and step S230 may be performed on the X-th group. After that, steps S310 and S315 may be performed on the first group, steps S320 and S325 may be performed on the second group, and steps S330 and S335 may be performed on the X-th group. Finally, step S405 may be performed on the groups checked by steps S315, S325 and S335. In example embodiments, address information of the first group may be stored in the step S315, address information of the second group may be stored in the step S325, and address information of the X-th group may be stored in the step S335.

In still other example embodiments, as illustrated in FIG. 11, the first partial verification operation in step S200, the operation of determining whether the second partial verification operation is required in step S300, and the second partial verification operation in step S400 may be sequentially performed on each of the first through X-th groups. The descriptions repeated with FIG. 9 will be omitted.

For example, steps S210 and S310 may be performed on the first group, and if the second partial verification operation is required (step S310: YES), the second partial verification operation may be performed on the first group (step S410). After that, steps S220 and S320 may be performed on the second group, and if the second partial verification operation is required (step S320: YES), the second partial verification operation may be performed on the second group (step S420). Finally, steps S230 and S330 may be performed on the X-th group, and if the second partial verification operation is required (step S330: YES), the second partial verification operation may be performed on the X-th group (step S430).

Figure 12:
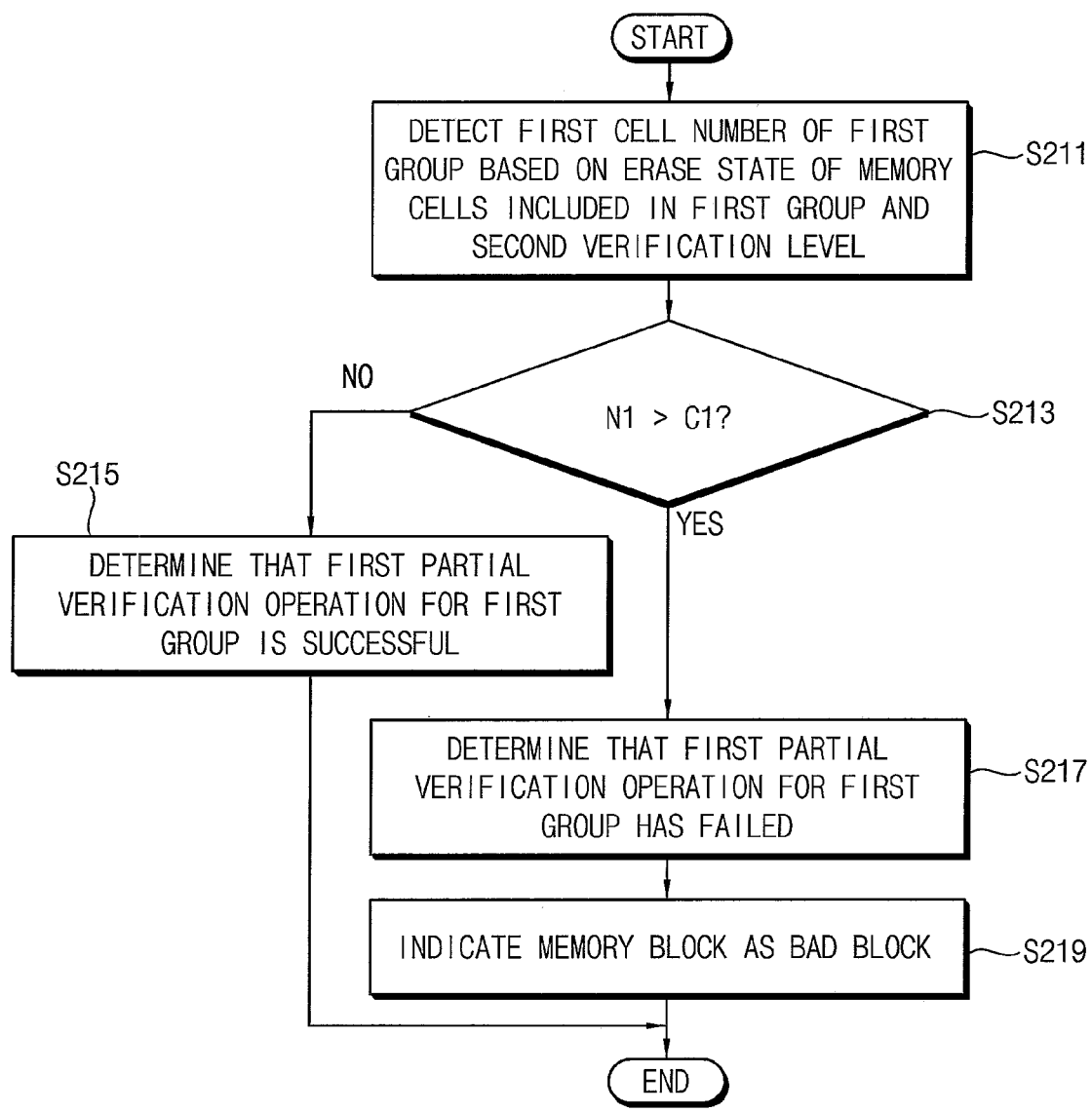
FIG. 12 is a flowchart illustrating an example of performing a first partial verification operation in FIG. 1 according to example embodiments.

FIG. 12 is a flowchart illustrating an example of performing a first partial verification operation in FIG. 1 according to example embodiments. FIGS. 13 and 14 are diagrams for describing an operation of FIG. 12 according to example embodiments.

Referring to FIGS. 1, 12, 13 and 14, when performing the first partial verification operation on one or more groups of the plurality of groups (step S200 in FIG. 1), FIG. 12 illustrates an operation of performing the first partial verification operation on the first group (e.g., step S210 in FIGS. 9, 10 and 11).

When performing the first partial verification operation on the first group (step S210), a first cell number of the first group may be detected based on an erase state of memory cells included in the first group and the second verification level (step S211). The second verification level may be different from the first verification level used in the erase verification operation of step S100. For example, step S211 may be performed using the erase verification voltage having the second verification level.

The first partial verification operation may be performed on the first group based on the first cell number (e.g., N1) and the first reference number (e.g., C1). For example, the first cell number N1 and the first reference number C1 may be compared, and it may be determined based on a result of the comparison whether the first partial verification operation is successful.

When the first cell number N1 is less than or equal to the first reference number C1 (step S213: NO), it may be determined that the first partial verification operation for the first group is successful (step S215), and after that, it may be determined whether the second partial verification operation is required for the first group.

When the first cell number N1 is greater than the first reference number C1 (step S213: YES), it may be determined that the first partial verification operation for the first group has failed (step S217). In this case, the memory block including the first group may be entirely indicated as a bad block (step S219), and the process according to example embodiments may be terminated.

In some example embodiments, the first cell number N1 of the first group detected in step S211 may represent the number of memory cells (e.g., the number of off cells) having a threshold voltage higher than the second verification level among the memory cells included in the first group. For example, the first cell number N1 may represent an off-cell count value associated with the first group.

Figures 13, 14:
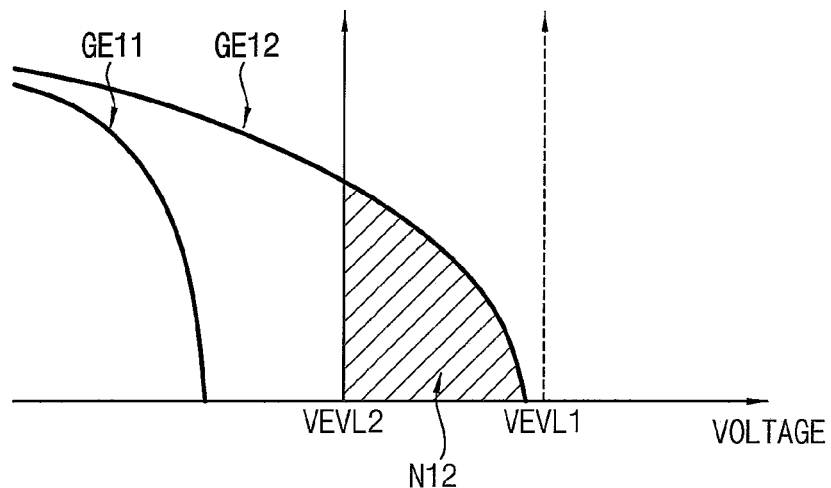
FIGS. 13 and 14 are diagrams for describing an operation of FIG. 12 according to example embodiments.

For example, when the memory cells included in the first group have a first group erase state (or a first group threshold voltage distribution) GE11 illustrated in FIG. 13, memory cells having a threshold voltage higher than a second verification level VEVL2 may not exist among the memory cells included in the first group. In this case, the first cell number N1 of the first group may be zero, and it may be determined that the first partial verification operation for the first group is successful.

For another example, when the memory cells included in the first group have a second group erase state GE12 illustrated in FIG. 13, N12 memory cells having a threshold voltage higher than the second verification level VEVL2 may exist among the memory cells included in the first group. A hatched region in FIG. 13 may correspond to the N12 memory cells. In this case, the first cell number N1 of the first group may be N12, and when N12>C1, it may be determined that the first partial verification operation for the first group has failed.

In some example embodiments, as illustrated in FIG. 13, the second verification level VEVL2 may be lower than the first verification level VEVL1. For example, the first partial verification operation in step S200 using the second verification level VEVL2 may be performed based on a stricter or stronger verification level criterion than the erase verification operation in step S100 using the first verification level VEVL1.

Although not illustrated in detail, an operation of performing the first partial verification operation on the second group (e.g., step S220 in FIGS. 9, 10 and 11) and an operation of performing the first partial verification operation on the X-th group (e.g., step S230 in FIGS. 9, 10 and 11) may be performed the same as described with reference to FIGS. 12 and 13, respectively.

In some example embodiments, the plurality of groups that are a target of the first partial verification operation may be divided or classified based on the plurality of wordlines connected to memory cells in the memory block. For example, the memory cells included in the first group may be connected to M wordlines among the plurality of wordlines, where M is a natural number greater than or equal to two. The first partial verification operation may be sequentially performed for each group.

For example, as illustrated in FIG. 14, one memory block may be connected to first through 4M wordlines. Memory cells connected to the first through M-th wordlines may form a first group, memory cells connected to the (M+1)-th through 2M-th wordlines may form a second group, memory cells connected to the (2M+1)-th through 3M-th wordlines may form a third group, and memory cells connected to the (3M+1)-th through 4M-th wordlines may form a fourth group.

A first partial verification operation PVFY1_1 for the first group, a first partial verification operation PVFY1_2 for the second group, a first partial verification operation PVFY1_3 for the third group and a first partial verification operation PVFY1_4 for the fourth group may be sequentially performed.

Although FIG. 14 illustrates an example based on the specific number of wordlines, the specific number of groups and the specific order of performing the first partial verification operation, the invention is not limited thereto. In addition, the plurality of groups may be divided based on a criterion other than the wordlines.

In example embodiments, when the first partial verification operation is performed on only one or more particular groups of the plurality of groups in the memory block, only the first partial verification operation PVFY1_1 for the first group or the first partial verification operation PVFY1_1 for the first group and the first partial verification operation PVFY1_2 for the second group may be performed. In this case, the memory cells connected to the first through M-th wordlines corresponding to the first group may be located in a lower region than memory cells connected to the other wordlines in one cell string (e.g., NS11, NS12, NS13, NS21, NS22, NS23, NS31, NS32 or NS33 in FIG. 4).

Figure 15:
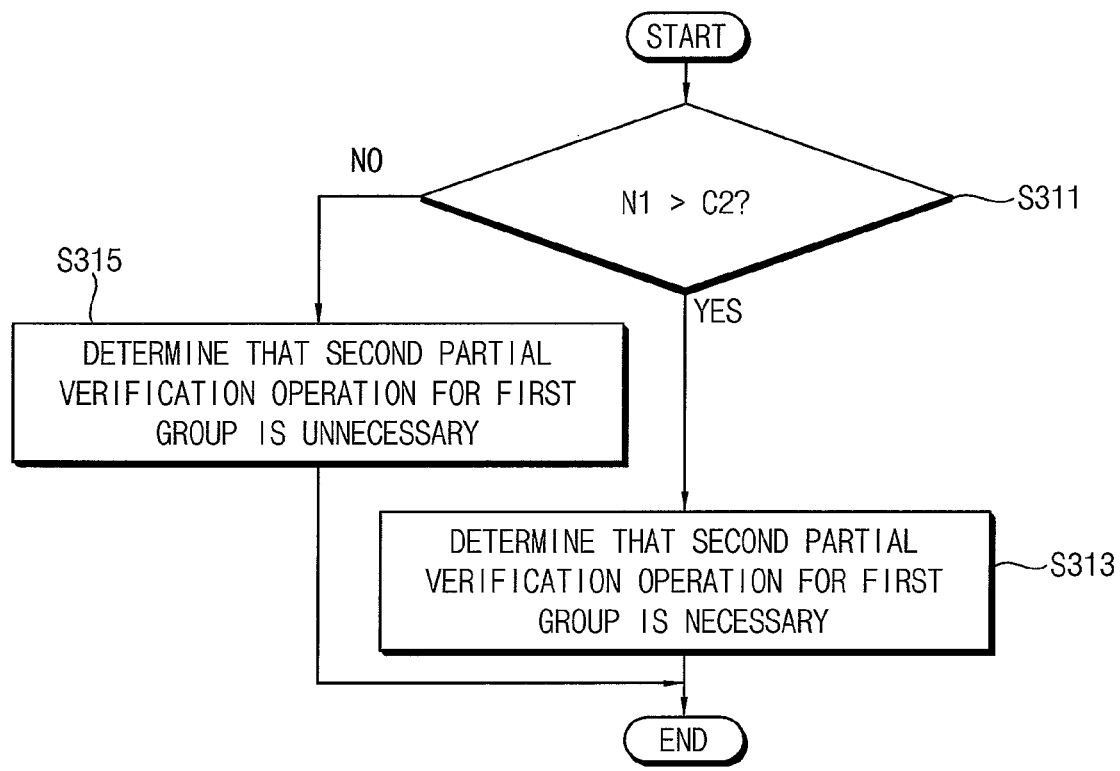
FIG. 15 is a flowchart illustrating an example of determining whether a second partial verification operation is required in FIG. 1 according to example embodiments.

FIG. 15 is a flowchart illustrating an example of determining whether a second partial verification operation is required in FIG. 1 according to example embodiments. FIG. 16 is a diagram for describing an operation of FIG. 15 according to example embodiments.

Figure 16:
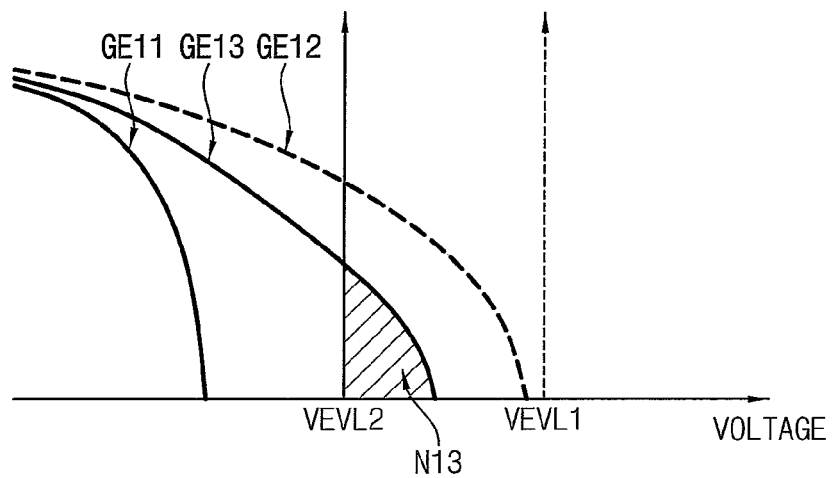
FIG. 16 is a diagram for describing an operation of FIG. 15 according to example embodiments.

Referring to FIGS. 1, 15 and 16, when determining whether the second partial verification operation is required for a group (step S300 in FIG. 1), FIG. 15 illustrates an operation of determining whether the second partial verification operation is required for the first group (e.g., step S310 in FIGS. 9, 10 and 11).

After the first partial verification operation for the first group is successfully completed, when determining whether the second partial verification operation is required for the first group (step S310 in FIGS. 9, 10 and 11), it may be determined whether the second partial verification operation is required for the first group based on the first cell number N1 detected in step S211 of FIG. 12 and the second reference number (e.g., C2). For example, the first cell number N1 and the second reference number C2 may be compared, and it may be determined based on a result of the comparison whether the second partial verification operation is required.

When the first cell number N1 is greater than the second reference number C2 (step S311: YES), it may be determined that the second partial verification operation for the first group is necessary (step S313), and after that, the second partial verification operation may be performed on the first group.

When the first cell number N1 is less than or equal to the second reference number C2 (step S311: NO), it may be determined that the second partial verification operation for the first group is unnecessary (step S315). In this case, the verification operation for the first group may be terminated.

In some example embodiments, the second reference number C2 may be less than or equal to the first reference number C1. For example, the second reference number C2 may be less than the first reference number C1 (e.g., C2<C1). For example, the operation of determining whether the second partial verification operation is required in step S300 of FIG. 1 using the second reference number C2 may be performed based on a different number criterion from the first partial verification operation in step S200 using the first reference number C1.

For example, when the memory cells included in the first group have a third group erase state GE13 illustrated in FIG. 16, N13 memory cells having a threshold voltage higher than the second verification level VEVL2 may exist among the memory cells included in the first group. In this case, the first cell number N1 of the first group may be N13, and when N13<C1 and N13>C2, it may be determined that the first partial verification operation for the first group is successful but the second partial verification operation for the first group is required.

Although not illustrated in detail, an operation of determining whether the second partial verification operation is required for the second group (e.g., step S320 in FIGS. 9, 10 and 11) and an operation of determining whether the second partial verification operation is required for the X-th group (e.g., step S330 in FIGS. 9, 10 and 11) may be performed the same as described with reference to FIGS. 15 and 16, respectively.

FIG. 17 is a flowchart illustrating an example of performing a second partial verification operation in FIG. 1 according to example embodiments. FIGS. 18A, 18B, 19A, 19B, 19C and 19D are diagrams for describing an operation of FIG. 17 according to example embodiments.

Referring to FIGS. 1, 17, 18A, 18B, 19A, 19B, 19C and 19D, when performing the second partial verification operation on at least some of the plurality of subgroups (step S400), FIG. 17 illustrates an operation of performing the second partial verification operation on a first subgroup in the first group when it is determined that the second partial verification operation for the first group is required.

When performing the second partial verification operation on the first subgroup, a second cell number of the first subgroup may be detected based on an erase state of memory cells included in the first subgroup and a third verification level (step S411). The third verification level may be different from the first verification level used in the erase verification operation of step S100 of FIG. 1. For example, step S411 may be performed using the erase verification voltage having the third verification level.

The second partial verification operation may be performed on the first subgroup based on the second cell number (e.g., N2) and the third reference number (e.g., C3). For example, the second cell number N2 and the third reference number C3 may be compared, and it may be determined based on a result of the comparison whether the second partial verification operation is successful. The third reference number C3 may be a reference number for one subgroup, and each of the first and second reference numbers C1 and C2 may be a reference number for one group, and thus the third reference number C3 may be different from the first and second reference numbers C1 and C2. For example, the third reference number C3 may be less than the first and second reference numbers C1 and C2.

When the second cell number N2 is less than or equal to the third reference number C3 (step S413: NO), it may be determined that the second partial verification operation for the first subgroup is successful (step S415). This may represent that the memory cells included in the first subgroup have a desired erase state.

When the second cell number N2 is greater than the third reference number C3 (step S413: YES), it may be determined that the second partial verification operation for the first subgroup has failed (step S417). In this case, the memory block including the first subgroup may be entirely indicated as a bad block (step S419), and the erase operation according to example embodiments may be terminated.

In some example embodiments, the second cell number N2 of the first subgroup detected in step S411 may represent the number of memory cells having a threshold voltage higher than the third verification level among the memory cells included in the first subgroup. For example, the second cell number N2 may represent an off-cell count value associated with the first subgroup.

Figure 18A:
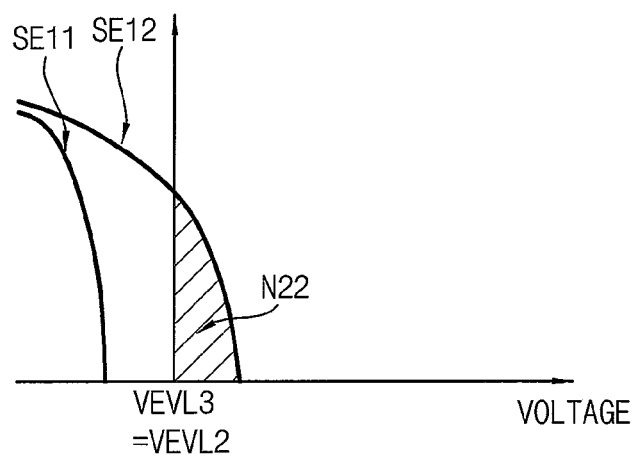
Figure 18B:
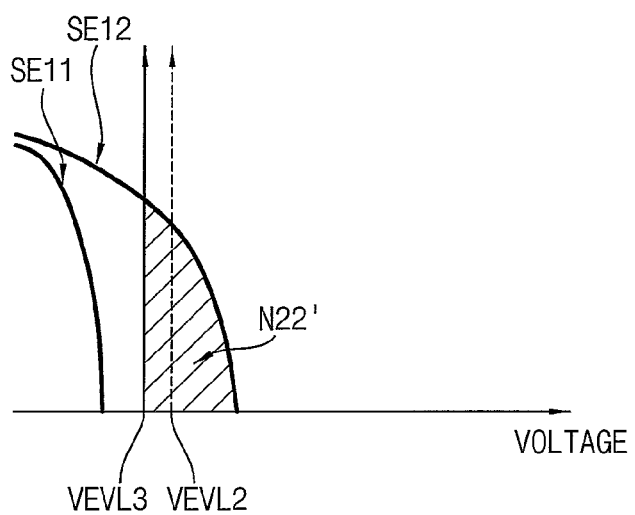

For example, when the memory cells included in the first subgroup have a first subgroup erase state (or a first subgroup threshold voltage distribution) SE11 illustrated in FIGS. 18A and 18B, memory cell having a threshold voltage higher than a third verification level VEVL3 may not exist among the memory cells included in the first subgroup. In this case, the second cell number N2 of the first subgroup may be zero, and it may be determined that the second partial verification operation for the first subgroup is successful.

For another example, when the memory cells included in the first subgroup have a second subgroup erase state SE12 illustrated in FIGS. 18A and 18B, N22 memory cells having a threshold voltage higher than the third verification level VEVL3 may exist among the memory cells included in the first subgroup in an example of FIG. 18A, and N22' memory cells having a threshold voltage higher than the third verification level VEVL3 may exist among the memory cells included in the first subgroup in an example of FIG. 18B. In this case, the second cell number N2 of the first subgroup may be N22 or N22', and when N22>C3 or N22'>C3, it may be determined that the second partial verification operation for the first subgroup has failed.

In some example embodiments, as illustrated in FIG. 18A, the third verification level VEVL3 may be equal to the second verification level VEVL2. In other example embodiments, as illustrated in FIG. 18B, the third verification level VEVL3 may be lower than the second verification level VEVL2.

Although not illustrated in detail, an operation of performing the second partial verification operation on each of subgroups in the first group other than the first subgroup may be performed the same as described with reference to FIGS. 17, 18A and 18B. In addition, an operation of performing the second partial verification operation on another group requiring the second partial verification operation may be performed the same as the operation of performing the second partial verification operation on the first group.

In some example embodiments, the plurality of subgroups that are a target of the second partial verification operation may be divided based on the plurality of wordlines connected to memory cells in the memory block. For example, when the memory cells included in the first group are connected to M wordlines, the memory cells included in one or more subgroups may be connected to N wordlines, where N is a natural number greater than or equal to one and less than M. The second partial verification operation may be sequentially performed for each subgroup.

Figures 19D, 20:
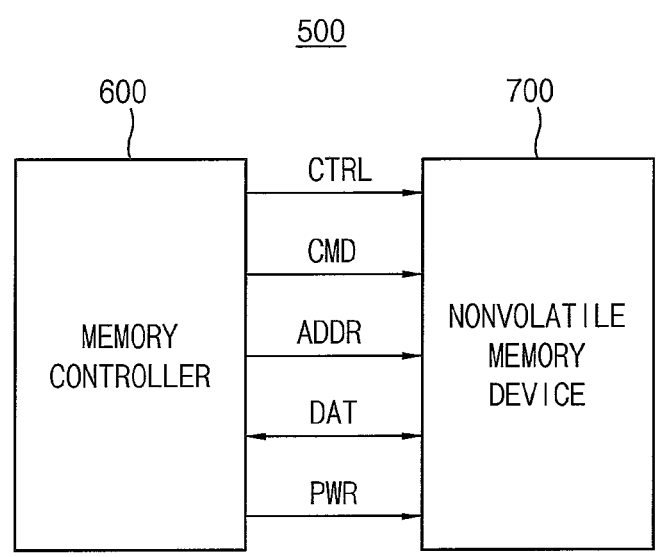

For example, as illustrated in FIGS. 19A, 19B, 19C and 19D, one or more subgroups may be connected to first through N-th wordlines. In some example embodiments, as illustrated in FIGS. 19A and 19D, memory cells connected to one wordline may form one subgroup. In other example embodiments, as illustrated in FIGS. 19B and 19C, memory cells connected to two or more wordlines may form one subgroup.

In examples of FIGS. 19A and 19D, memory cells connected to the first wordline may form a first subgroup, memory cells connected to the second wordline may form a second subgroup, memory cells connected to the third wordline may form a third subgroup, memory cells connected to the fourth wordline may form a fourth subgroup, memory cells connected to the (N−1)-th wordline may form a (N−1)-th subgroup, and memory cells connected to the N-th wordline may form a N-th subgroup. In an example of FIG. 19B, memory cells connected to the first and second wordlines may form a first subgroup, memory cells connected to the third and fourth wordlines may form a second subgroup, and memory cells connected to the (N−1)-th and N-th wordlines may form a N/2-th subgroup. In an example of FIG. 19C, memory cells connected to the first, second and third wordlines may form a first subgroup, memory cells connected to the fourth, fifth and sixth wordlines may form a second subgroup, and memory cells connected to the (N−2)-th, (N−1)-th and N-th wordlines may form a N/3-th subgroup.

In some example embodiments, as illustrated in FIGS. 19A, 19B and 19C, the second partial verification operation may be sequentially performed on all of subgroups included in one group. In the example of FIG. 19A, a second partial verification operation PVFY2_1 for the first subgroup, a second partial verification operation PVFY2_2 for the second subgroup, a second partial verification operation PVFY2_3 for the third subgroup, a second partial verification operation PVFY2_4 for the fourth subgroup, a second partial verification operation PVFY2_(Y1−1) for the (N−1)-th subgroup and a second partial verification operation PVFY2_Y1 for the N-th subgroup may be sequentially performed (e.g., Y1=N). In the example of FIG. 19B, a second partial verification operation PVFY2_1 for the first subgroup, a second partial verification operation PVFY2_2 for the second subgroup and a second partial verification operation PVFY2_Y2 for the N/2-th subgroup may be sequentially performed (e.g., Y2=N/2). In the example of FIG. 19C, a second partial verification operation PVFY2_1 for the first subgroup, a second partial verification operation PVFY2_2 for the second subgroup and a second partial verification operation PVFY2_Y3 for the N/3-th subgroup may be sequentially performed (e.g., Y3=N/3).

In other example embodiments, as illustrated in FIG. 19D, the second partial verification operation may be sequentially performed on only some of subgroups included in one group. In the example of FIG. 19D, a second partial verification operation PVFY2_1 for the first subgroup, a second partial verification operation PVFY2_2 for the third subgroup, a second partial verification operation PVFY2_3 for the fourth subgroup and a second partial verification operation PVFY2_Y4 for the N-th subgroup may be sequentially performed (e.g., Y4<N), and the second partial verification operation for the second and (N−1)-th subgroups may be omitted. For example, the second partial verification operation for the second and (N−1)-th subgroups may be omitted by providing an address corresponding to the omitted subgroups.

Although FIGS. 19A, 19B, 19C and 19D illustrate examples based on the specific number of wordlines, the specific number of groups and the specific order of performing the second partial verification operation, the invention is not limited thereto. In addition, the plurality of subgroups may be divided based on a criterion other than the wordlines.

FIG. 20 is a block diagram illustrating a memory system according to example embodiments.

Referring to FIG. 20, a memory system 500 may include a memory controller 600 and at least one nonvolatile memory device 700.

The nonvolatile memory device 700 may correspond to the nonvolatile memory device according to example embodiments described with reference to FIGS. 1 to 5, 6A to 6C, 7 to 17, 18A, 18B, and 19A to 19D, and may perform data erase, program (or write) and/or read operations under control of the memory controller 600. The nonvolatile memory device 700 may receive a command CMD and an address ADDR through I/O lines from the memory controller 600 for performing such operations, and may exchange data DAT with the memory controller 600 for performing such program or read operation. In addition, the nonvolatile memory device 700 may receive a control signal CTRL through a control line from the memory controller 600. In addition, the nonvolatile memory device 700 receives a power PWR through a power line from the memory controller 600.

Figure 21:
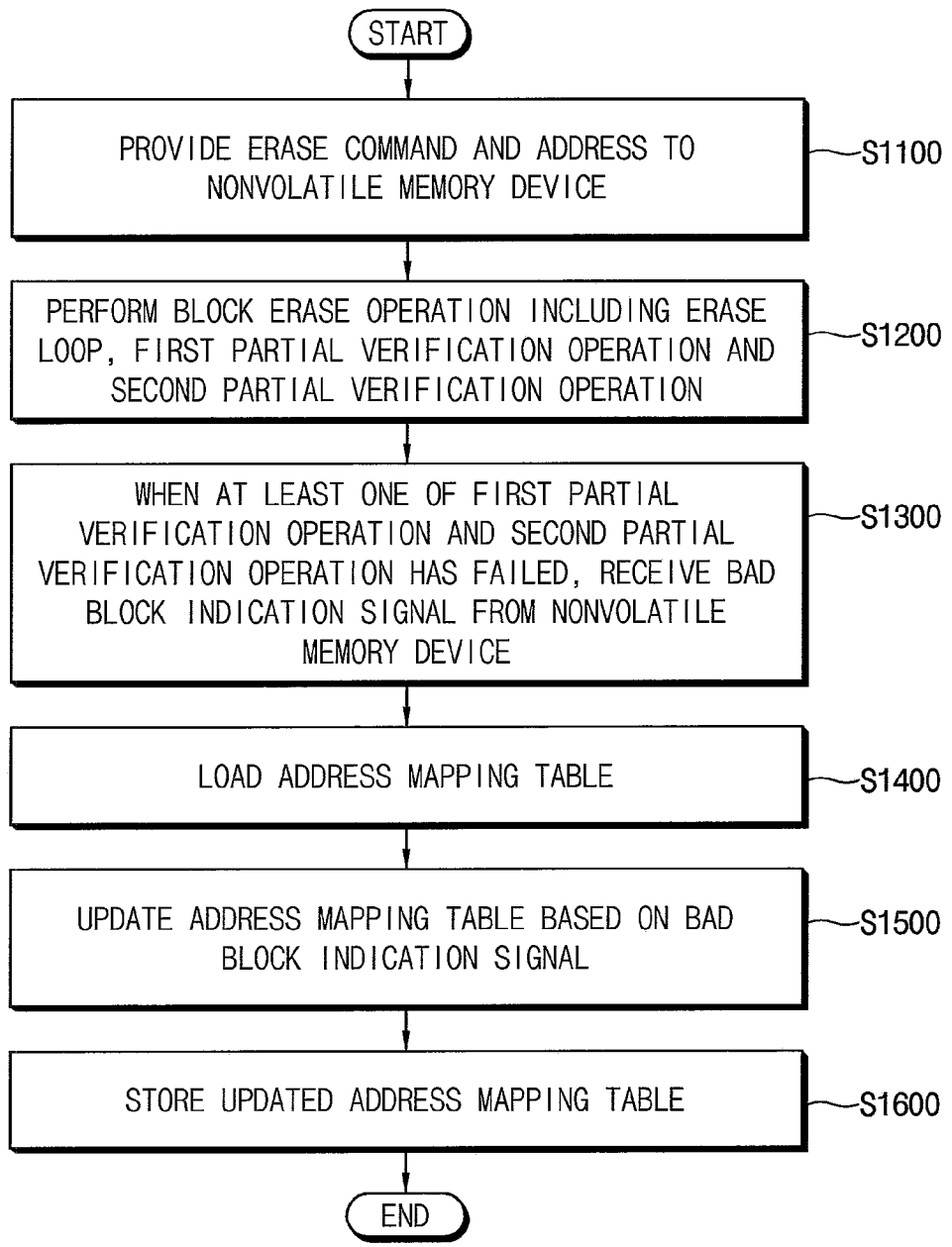
FIG. 21 is a flowchart illustrating a method of operating a memory system according to example embodiments.

FIG. 21 is a flowchart illustrating a method of operating a memory system according to example embodiments.

Referring to FIG. 21, a method of operating a memory system according to example embodiments may be performed by a memory system that includes a memory controller and a nonvolatile memory device. The nonvolatile memory device may be the nonvolatile memory device according to example embodiments described with reference to FIGS. 1 to 5, 6A to 6C, 7 to 17, 18A, 18B, and 19A to 19D.

In the method of operating the memory system according to example embodiments, the memory controller generates an erase command and an address corresponding to a memory block to be erased, and provides the erase command and the address to the nonvolatile memory device (step S1100).

The nonvolatile memory device performs a block erase operation on the memory block based on the erase command and the address (step S1200). The block erase operation includes an erase loop, a first partial verification operation and a second partial verification operation. Step S1200 may be performed based on the method of erasing data according to example embodiments described with reference to FIGS. 1 through 19.

When at least one of the first partial verification operation and the second partial verification operation has failed, the memory controller receives a bad block indication signal for the memory block from the nonvolatile memory device (step S1300).

The memory controller loads an address mapping table including address information of the memory block from a buffer memory that is an internal memory included in the memory controller (step S1400). The memory controller updates the address mapping table based on the bad block indication signal to invalidate the address information of the memory block (step S1500). The memory controller stores the updated address mapping table in the buffer memory (step S1600).

In some example embodiments, the method of operating the memory system of FIG. 21 may be described as a method of operating the memory controller.

Figure 22:
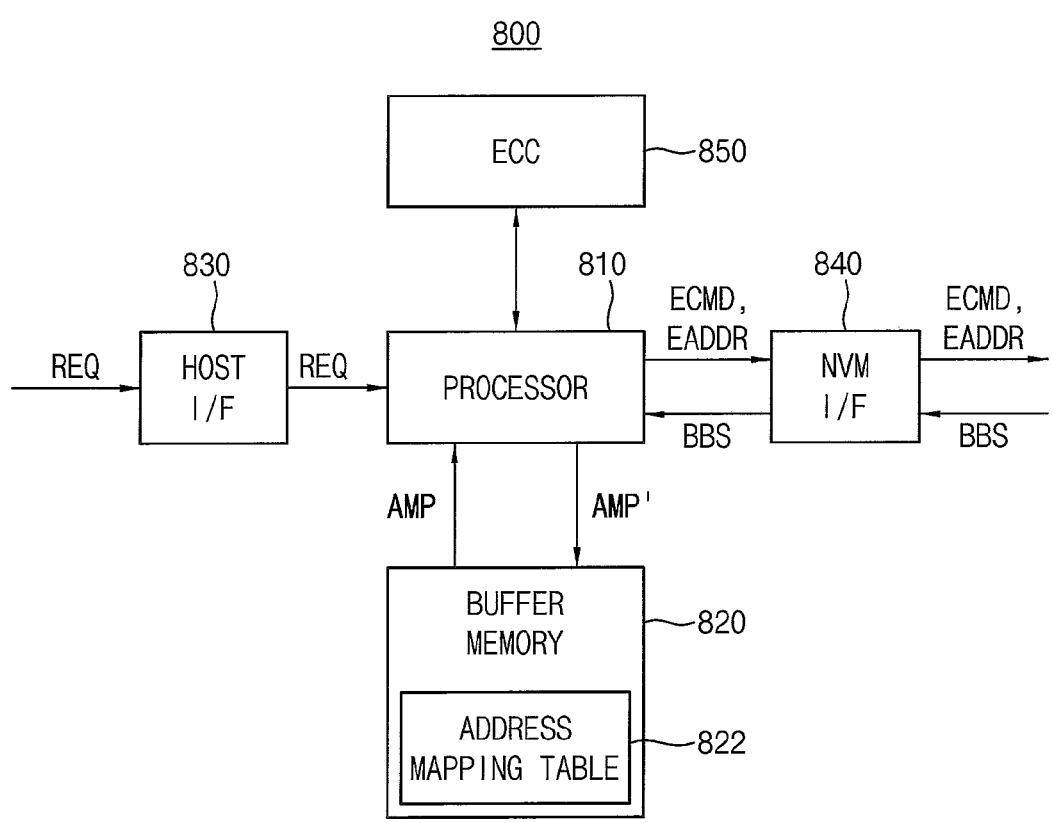
FIG. 22 is a block diagram illustrating a memory controller according to example embodiments.

FIG. 22 is a block diagram illustrating a memory controller according to example embodiments. FIGS. 23A and 23B are diagrams for describing an operation of the memory controller of FIG. 22 according to example embodiments.

Referring to FIG. 22, a memory controller 800 includes at least one processor 810, a buffer memory 820, a host interface 830, a nonvolatile memory interface 840 and an error correction code (ECC) block 850. The memory controller 800 may be the memory controller 600 of FIG. 20.

The processor 810 may control an operation of the memory controller 800 in response to a command received via the host interface 830 from an external host device (not illustrated). In some example embodiments, the processor 810 may control respective components by employing firmware for operating a nonvolatile memory device (e.g., the nonvolatile memory device 100 of FIG. 2 or the nonvolatile memory device 700 of FIG. 20).

The buffer memory 820 may store instructions and data executed and processed by the processor 810. For example, the buffer memory 820 may store an address mapping table 822. For example, the buffer memory 820 may be implemented with a volatile memory device such as a dynamic random access memory (DRAM), a static random access memory (SRAM), a cache memory, or the like.

The host interface 830 may provide physical connections between the host device and the memory controller 800. The host interface 830 may provide an interface corresponding to a bus format of the host for communication between the host device and the memory controller 800. In some example embodiments, the bus format of the host device may be a small computer system interface (SCSI) or a serial attached SCSI (SAS) interface. In other example embodiments, the bus format of the host device may be a USB, a peripheral component interconnect (PCI) express (PCIe), an advanced technology attachment (ATA), a parallel ATA (PATA), a serial ATA (SATA), a nonvolatile memory (NVM) express (NVMe), etc., format.

The nonvolatile memory interface 840 may exchange data with the nonvolatile memory device. The nonvolatile memory interface 840 may transfer data to the nonvolatile memory device, or may receive data read from the nonvolatile memory device 100 of FIG. 2 or the nonvolatile memory device 700 of FIG. 20. In some example embodiments, the nonvolatile memory interface 840 may be connected to the nonvolatile memory device via one channel. In other example embodiments, the nonvolatile memory interface 840 may be connected to the nonvolatile memory device via two or more channels.

The ECC block 850 for error correction may perform coded modulation using a Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), a block coded modulation (BCM), etc., or may perform ECC encoding and ECC decoding using above-described codes or other error correction codes.

The memory controller 800 may perform the method described with reference to FIG. 21. For example, the processor 810 generates an erase command ECMD and an address EADDR based on a request REQ received from the host device via the host interface 830, and provides the erase command ECMD and the address EADDR to the nonvolatile memory device via the nonvolatile memory interface 840. When at least one of the first partial verification operation and the second partial verification operation has failed while the block erase operation is performed in the nonvolatile memory device, the processor 810 receives a bad block indication signal BBS via the nonvolatile memory interface 840, loads data AMP corresponding to the address mapping table 822 from the buffer memory 820, updates the address mapping table 822 to invalidate specific address information based on the bad block indication signal BBS, and stores updated data AMP' corresponding to the updated address mapping table 822 in the buffer memory 820.

Referring to FIGS. 23A and 23B, the address mapping table 822 stored in the buffer memory 820 of FIG. 22 is illustrated.

The address mapping table 822 may include a plurality of memory blocks, corresponding logical addresses LA1, LA2, LA3 and LA4, corresponding physical addresses PA1, PA2, PA3 and PA4, and state information of the plurality of memory blocks. As illustrated in FIG. 23A, before the bad block indication signal BBS is received, all memory of the blocks may be in or have a valid state VA. As illustrated in FIG. 23B, when the bad block indication signal BBS is received, corresponding memory block (e.g., the first memory block) may be converted to an invalid state INVA and may no longer be used.

Figure 24:
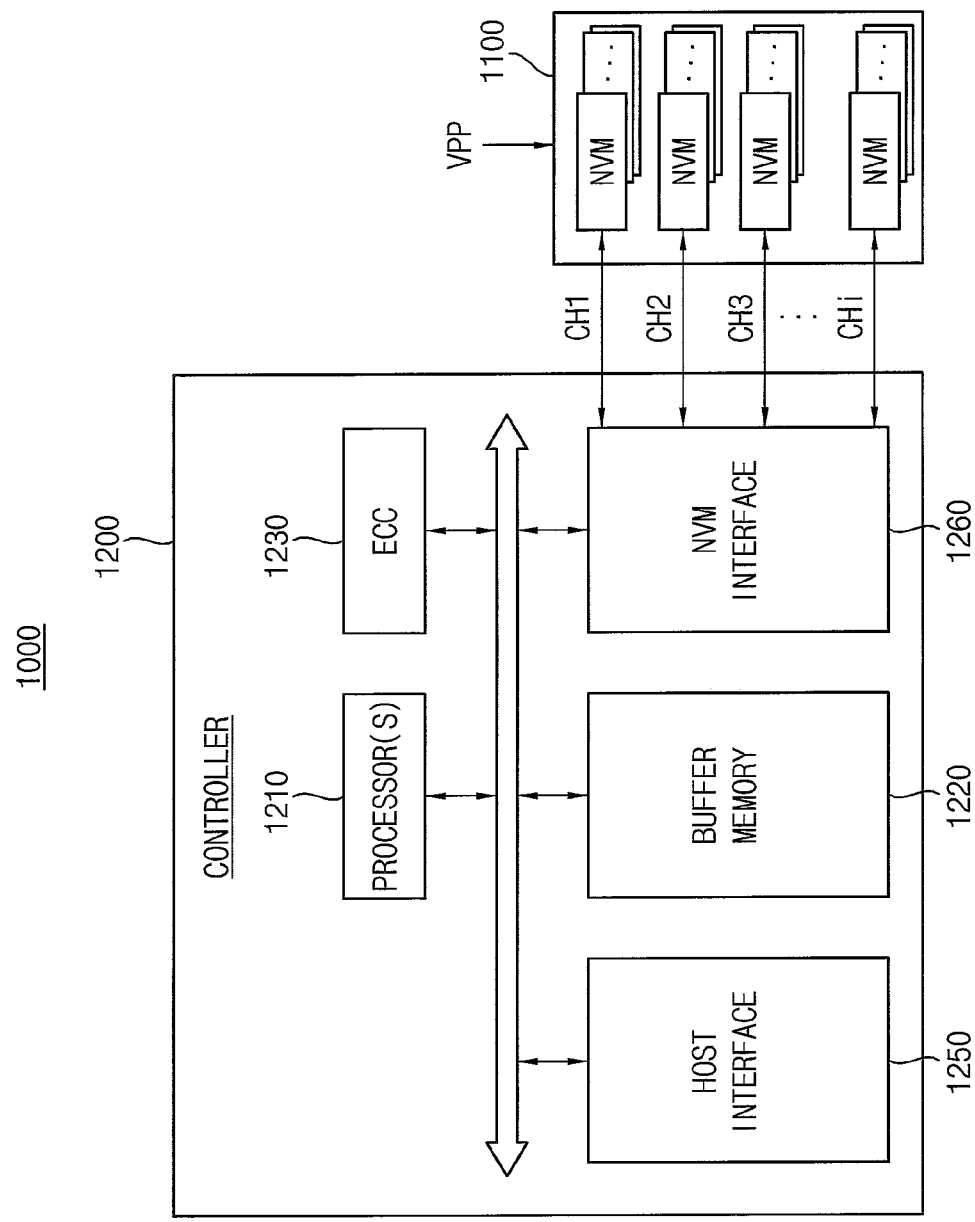
FIG. 24 is a block diagram illustrating a storage device that includes a nonvolatile memory device according to example embodiments.

FIG. 24 is a block diagram illustrating a storage device that includes a nonvolatile memory device according to example embodiments.

Referring to FIG. 24, a storage device 1000 may include a plurality of nonvolatile memory devices 1100 and a controller 1200. For example, the storage device 1000 may be any storage device such as an embedded multimedia card (eMMC), a universal flash storage (UFS), a solid state disc or solid state drive (SSD), etc.

The controller 1200 may be connected to the nonvolatile memory devices 1100 via a plurality of channels CH1, CH2, CH3 . . . , and CHi. The controller 1200 may include one or more processors 1210, a buffer memory 1220, an error correction code (ECC) circuit 1230, a host interface 1250 and a nonvolatile memory interface 1260 that correspond to the processor 810, the buffer memory 820, the ECC block 850, the host interface 830 and the nonvolatile memory interface 840 in FIG. 22, respectively.

Each of the nonvolatile memory devices 1100 may correspond to one of the nonvolatile memory devices 100 and 700 of FIGS. 2 and 20 according to example embodiments, and may be optionally supplied with an external high voltage VPP.

Figure 25:
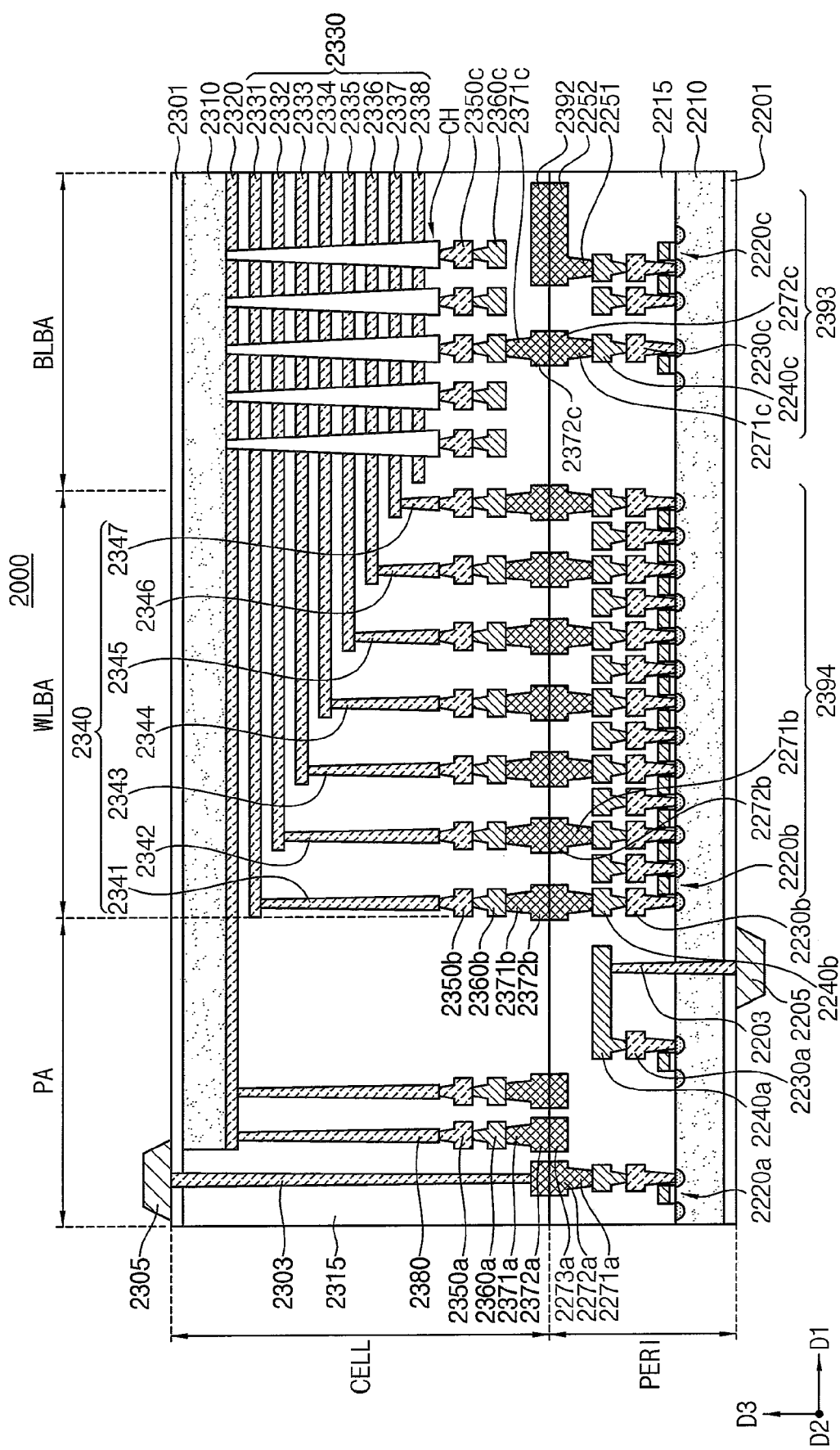
FIG. 25 is a cross-sectional view of a nonvolatile memory device according to example embodiments.

FIG. 25 is a cross-sectional view of a nonvolatile memory device according to example embodiments.

Referring to FIG. 25, a nonvolatile memory device or a memory device 2000 may have a chip-to-chip (C2C) structure. The C2C structure may refer to a structure formed by manufacturing an upper chip including a memory cell region or a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 2000 may include an external pad bonding area PA, a wordline bonding area WLBA, and a bitline bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. Each of the circuit elements 2220a, 2220b, and 2220c may include one or more transistors. In an example embodiment, the first metal layers 2230a, 2230b, and 2230c may be formed of tungsten having relatively high electrical resistivity, and the second metal layers 2240a, 2240b, and 2240c may be formed of copper having relatively low electrical resistivity.

In an example embodiment illustrate in FIG. 25, although only the first metal layers 2230a, 2230b, and 2230c and the second metal layers 2240a, 2240b, and 2240c are shown and described, the invention is not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the wordline bonding area WLBA. In the wordline bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of aluminum, copper, tungsten, or the like.

The upper bonding metals 2371b and 2372b in the cell region CELL may be referred as first metal pads and the lower bonding metals 2271b and 2272b in the peripheral circuit region PERI may be referred as second metal pads. Further, the first metal pads and the second metal pads may be connected to each other in a bonding manner.

The cell region CELL may include at least one memory block. The cell region CELL may include a second substrate 2310 and a common source line 2320. On the second substrate 2310, a plurality of wordlines 2331, 2332, 2333, 2334, 2335, 2336, 2337, and 2338 (i.e., 2330) may be stacked in a third direction D3 (e.g., a Z-axis direction), perpendicular to an upper surface of the second substrate 2310. At least one string selection line and at least one ground selection line may be arranged on and below the plurality of wordlines 2330, respectively, and the plurality of wordlines 2330 may be disposed between the at least one string selection line and the at least one ground selection line.

In the bitline bonding area BLBA, a channel structure CH may extend in the third direction D3 (e.g., the Z-axis direction), perpendicular to the upper surface of the second substrate 2310, and pass through the plurality of wordlines 2330, the at least one string selection line, and the at least one ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bitline contact, and the second metal layer 2360c may be a bitline. In an example embodiment, the bitline 2360c may extend in a second direction D2 (e.g., a Y-axis direction), parallel to the upper surface of the second substrate 2310.

In an example embodiment illustrated in FIG. 25, an area in which the channel structure CH, the bitline 2360c, and the like are disposed may be defined as the bitline bonding area BLBA. In the bitline bonding area BLBA, the bitline 2360c may be electrically connected to the circuit elements 2220c providing a page buffer 2393 in the peripheral circuit region PERI. The bitline 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the wordline bonding area WLBA, the plurality of wordlines 2330 may extend in a first direction D1 (e.g., an X-axis direction), parallel to the upper surface of the second substrate 2310 and perpendicular to the second direction D2, and may be connected to a plurality of cell contact plugs 2341, 2342, 2343, 2344, 2345, 2346, and 2347 (i.e., 2340). The plurality of wordlines 2330 and the plurality of cell contact plugs 2340 may be connected to each other in pads provided by at least a portion of the plurality of wordlines 2330 extending in different lengths in the first direction D1. A first metal layer 2350b and a second metal layer 2360b may be connected to an upper portion of the plurality of cell contact plugs 2340 connected to the plurality of wordlines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the wordline bonding area WLBA.

The plurality of cell contact plugs 2340 may be electrically connected to the circuit elements 2220b forming a row decoder 2394 in the peripheral circuit region PERI. In an example embodiment, operating voltages of the circuit elements 2220b forming the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310, and a second input/output pad 2305 may be disposed on the upper insulating layer 2301. The second input/output pad 2305 may be connected to at least one of the plurality of circuit elements 2220a, 2220b, and 2220c disposed in the peripheral circuit region PERI through a second input/output contact plug 2303. In the example embodiment, the second input/output pad 2305 is electrically connected to a circuit element 2220a.

According to embodiments, the second substrate 2310 and the common source line 2320 may not be disposed in an area in which the second input/output contact plug 2303 is disposed. Also, the second input/output pad 2305 may not overlap the wordlines 2330 in the third direction D3 (e.g., the Z-axis direction). The second input/output contact plug 2303 may be separated from the second substrate 2310 in the direction, parallel to the upper surface of the second substrate 2310, and may pass through an interlayer insulating layer 2315 of the cell region CELL to be connected to the second input/output pad 2305 and an upper metal pattern 2372a of the cell region CELL.

According to embodiments, the first input/output pad 2205 and the second input/output pad 2305 may be selectively formed. For example, the memory device 2000 may include only the first input/output pad 2205 disposed on the lower insulating film 2201 in contact with the first substrate 2210 or the second input/output pad 2305 disposed on the upper insulating film 2301 in contact with the second substrate 2310. Alternatively, the memory device 2000 may include both the first input/output pad 2205 and the second input/output pad 2305.

A metal pattern provided on an uppermost metal layer may be provided as a dummy pattern or the uppermost metal layer may be absent, in each of the external pad bonding area PA and the bitline bonding area BLBA, respectively included in the cell region CELL and the peripheral circuit region PERI.

In the external pad bonding area PA, the memory device 2000 may include a lower metal pattern 2273a, corresponding to the upper metal pattern 2372a formed in an uppermost metal layer of the cell region CELL, and having the same cross-sectional shape as the upper metal pattern 2372a of the cell region CELL so as to be connected to each other, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern 2372a, corresponding to the lower metal pattern 2273a formed in an uppermost metal layer of the peripheral circuit region PERI, and having the same shape as a lower metal pattern 2273a of the peripheral circuit region PERI, may be formed in an uppermost metal layer of the cell region CELL.

The lower bonding metals 2271b and 2272b may be formed on the second metal layer 2240b in the wordline bonding area WLBA. In the wordline bonding area WLBA, the lower bonding metals 2271b and 2272b of the peripheral circuit region PERI may be electrically connected to the upper bonding metals 2371b and 2372b of the cell region CELL by a Cu-to-Cu bonding.

Further, in the bitline bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

The method according to example embodiments disclosed herein may be applied or employed to the memory device 2000, and the memory device 2000 may be implemented to perform the method according to example embodiments disclosed herein. For example, the erase voltage, the erase verification voltage, and related signals used to perform the method according to example embodiments may be applied through the illustrated bonding structure.

In an example embodiment, the nonvolatile memory device 2000, such as described in FIG. 25, can operate and can include device components according to one or more of the example embodiments described in FIGS. 1 to 5, 6A to 6C, 7 to 17, 18A, 18B, 19A to 19D, 20 to 22, 23A, 23B, and 24, previously.

The disclosure of the invention may be applied to various devices and systems that include the nonvolatile memory devices. For example, the invention may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the invention. Accordingly, all such modifications are intended to be included within the scope of the invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of erasing data in a nonvolatile memory device including one or more memory blocks, a plurality of memory cells being disposed in a vertical direction in each memory block, the method comprising:
   performing an erase loop once or more on an entire of a first memory block in the one or more memory blocks, the erase loop including an erase operation and an erase verification operation;
   after the erase loop is successfully completed, performing a first partial verification operation on one or more groups of a plurality of groups in the first memory block, the first memory block being divided into the plurality of groups;
   after the first partial verification operation is successfully completed, determining whether a second partial verification operation is required for a group of the one or more groups; and
   performing the second partial verification operation on one or more subgroups of a plurality of subgroups in a first group requiring the second partial verification operation among the plurality of groups, the first group being divided into the plurality of subgroups.

2. The method of claim 1, wherein performing the first partial verification operation on one or more groups of the plurality of groups includes:
   detecting a first cell number of the first group based on an erase state of memory cells included in the first group and an erase verification voltage having a second verification level that is different from an erase verification voltage having a first verification level used in the erase verification operation of the erase loop; and
   performing the first partial verification operation on the first group based on the first cell number and a first reference number.

3. The method of claim 2, wherein performing the first partial verification operation on the first group includes:
   when the first cell number is less than or equal to the first reference number, determining that the first partial verification operation for the first group is successful; and when the first cell number is greater than the first reference number, determining that the first partial verification operation for the first group has failed.

4. The method of claim 3, wherein, when it is determined that the first partial verification operation has failed, the first memory block is indicated as a bad block.

5. The method of claim 2, wherein:
the plurality of memory cells included in the first memory block are connected to a plurality of wordlines, and
the memory cells included in the first group are connected to M wordlines among the plurality of wordlines, where M is a natural number greater than or equal to two.

6. The method of claim 2, wherein the first cell number represents a number of memory cells in which a level of a threshold voltage is higher than the second verification level among the memory cells included in the first group.

7. The method of claim 2, wherein the second verification level is lower than the first verification level.

8. The method of claim 2, wherein determining whether the second partial verification operation is required for a group of the one or more groups includes:
determining whether the second partial verification operation is required for the first group based on the first cell number and a second reference number.

9. The method of claim 8, wherein determining whether the second partial verification operation is required for the first group includes:
when the first cell number is greater than the second reference number, determining that the second partial verification operation for the first group is necessary; and
when the first cell number is less than or equal to the second reference number, determining that the second partial verification operation for the first group is unnecessary.

10. The method of claim 8, wherein the second reference number is less than or equal to the first reference number.

11. The method of claim 8, wherein performing the second partial verification operation on one or more subgroups of the plurality of subgroups in the first group includes:
when it is determined that the second partial verification operation for the first group is required, detecting a second cell number of a first subgroup of the plurality of subgroups in the first group based on an erase state of memory cells included in the first subgroup and an erase verification voltage having a third verification level that is different from the first verification level; and
performing the second partial verification operation on the first subgroup based on the second cell number and a third reference number that is different from the first and second reference numbers.

12. The method of claim 11, wherein performing the second partial verification operation on the first subgroup includes:
when the second cell number is less than or equal to the third reference number, determining that the second partial verification operation for the first subgroup is successful; and
when the second cell number is greater than the third reference number, determining that the second partial verification operation for the first subgroup has failed.

13. The method of claim 12, wherein, when it is determined that the second partial verification operation has failed, the first memory block is indicated as a bad block.

14. The method of claim 11, wherein:
the memory cells included in the first group are connected to M wordlines, where M is a natural number greater than or equal to two, and
the memory cells included in the first subgroup are connected to N wordlines, where N is a natural number greater than or equal to one and less than M.

15. The method of claim 11, wherein the second cell number represents a number of memory cells in which a level of a threshold voltage is higher than the third verification level among the memory cells included in the first subgroup.

16. The method of claim 11, wherein the third verification level is lower than or equal to the second verification level.

17. The method of claim 11, wherein the third reference number is less than the first and second reference numbers.

18. The method of claim 1, wherein:
the plurality of groups include first through X-th groups, where X is a natural number greater than or equal to two,
the first partial verification operation and an operation of determining whether the second partial verification operation is required are sequentially performed on each of the first through X-th groups, and
the second partial verification operation is sequentially performed only on one or more groups requiring the second partial verification operation among the first through X-th groups.

19. A nonvolatile memory device comprising:
a memory block including a plurality of memory cells disposed in a vertical direction; and
a control circuit configured to:
perform an erase loop once or more on an entire of the memory block,
perform a first partial verification operation on one or more groups of a plurality of groups in the memory block,
determine whether a second partial verification operation is required for a group of the one or more groups, and
perform the second partial verification operation on one or more subgroups of a plurality of subgroups in a group requiring the second partial verification operation among the plurality of groups,
wherein the erase loop includes an erase operation and an erase verification operation,
wherein the memory block is divided into the plurality of groups, and
wherein the group requiring the second partial verification operation is divided into the plurality of subgroups.

20. A method of erasing data in a nonvolatile memory device including one or more memory blocks, a plurality of memory cells being disposed in a vertical direction in each memory block, the method comprising:
performing an erase loop once or more on an entire of a first memory block in the one or more memory blocks, the erase loop including an erase operation performed using an erase voltage and an erase verification operation performed using a first verification voltage having a first verification level;
after the erase loop is successfully completed, performing a first partial verification operation on one or more groups of a plurality of groups in the first memory block using a first reference number and a second verification voltage having a second verification level different from the first verification level, the first memory block being divided into the plurality of groups;

after the first partial verification operation is successfully completed, determining whether a second partial verification operation is required for a group of the one or more groups using a second reference number less than or equal to the first reference number; and performing the second partial verification operation on all or some of a plurality of subgroups in a group requiring the second partial verification operation among the plurality of groups using a third verification voltage having a third verification level different from the first verification level and a third reference number different from the first and second reference numbers, the group requiring the second partial verification operation being divided into the plurality of subgroups, wherein, when at least one of the first partial verification operation and the second partial verification operation has failed, the first memory block is indicated as a bad block.

* * * * *